United States Patent
Takata

(10) Patent No.: US 11,929,737 B2
(45) Date of Patent: Mar. 12, 2024

(54) ACOUSTIC WAVE FILTER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 540 days.

(21) Appl. No.: 17/151,841

(22) Filed: Jan. 19, 2021

(65) Prior Publication Data

US 2021/0143796 A1   May 13, 2021

Related U.S. Application Data

(63) Continuation of application No. PCT/JP2019/031014, filed on Aug. 6, 2019.

(30) Foreign Application Priority Data

Aug. 13, 2018  (JP) ................. 2018-152203

(51) Int. Cl.
  *H03H 9/64* (2006.01)
  *H03H 9/02* (2006.01)
  *H03H 9/25* (2006.01)

(52) U.S. Cl.
  CPC ...... *H03H 9/6483* (2013.01); *H03H 9/02228* (2013.01); *H03H 9/02992* (2013.01); *H03H 9/25* (2013.01); *H03H 9/6406* (2013.01)

(58) Field of Classification Search
  CPC ............. H03H 9/6483; H03H 9/02228; H03H 9/02992; H03H 9/25; H03H 9/6406;
  (Continued)

(56) References Cited

U.S. PATENT DOCUMENTS

| | | | |
|---|---|---|---|
| 5,844,453 | A | 12/1998 | Matsui et al. |
| 2019/0036554 | A1 | 1/2019 | Ito et al. |

(Continued)

FOREIGN PATENT DOCUMENTS

| | | | |
|---|---|---|---|
| JP | 08-65089 | A | 3/1996 |
| JP | H08330897 | A | 12/1996 |

(Continued)

OTHER PUBLICATIONS

Official Communication issued in International Patent Application No. PCT/JP2019/031014, dated Oct. 21, 2019.
Office Action in JP2022-048902, dated Apr. 18, 2023, 4 pages.

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

An acoustic wave filter includes at least one serial arm resonance circuit on a path connecting input/output terminals, and at least one parallel arm resonance circuit between a node on the path and a ground, in which each of the at least one serial arm resonance circuit and the at least one parallel arm resonance circuit includes an acoustic wave resonator, a first parallel arm resonance circuit of the at least one parallel arm resonance circuit includes a bridging capacitor connected in parallel to the acoustic wave resonator, an anti-resonant frequency of the first parallel arm resonance circuit is positioned on a higher-frequency side than the pass band, and a resonant frequency of a first serial arm resonance circuit of the at least one serial arm resonance circuit is positioned on a lower-frequency side than the anti-resonant frequency of the first parallel arm resonance circuit.

19 Claims, 14 Drawing Sheets

(58) Field of Classification Search
CPC ............. H03H 9/02574; H03H 9/0274; H03H 9/14526; H03H 9/1457; H03H 9/14541; H03H 9/725

See application file for complete search history.

(56) References Cited

U.S. PATENT DOCUMENTS

2019/0190491 A1  6/2019  Nosaka
2019/0267970 A1  8/2019  Nosaka

FOREIGN PATENT DOCUMENTS

| JP | 2012-147175 A | 8/2012 | |
|---|---|---|---|
| JP | 2013247569 A | 12/2013 | |
| WO | 2014/034492 A1 | 3/2014 | |
| WO | 2014167755 A1 | 10/2014 | |
| WO | 2017/131170 A1 | 8/2017 | |
| WO | 2018/043608 A1 | 3/2018 | |
| WO | 2018/097203 A1 | 5/2018 | |
| WO | WO-2019111902 A1 * | 6/2019 | ......... H03H 9/02566 |

* cited by examiner

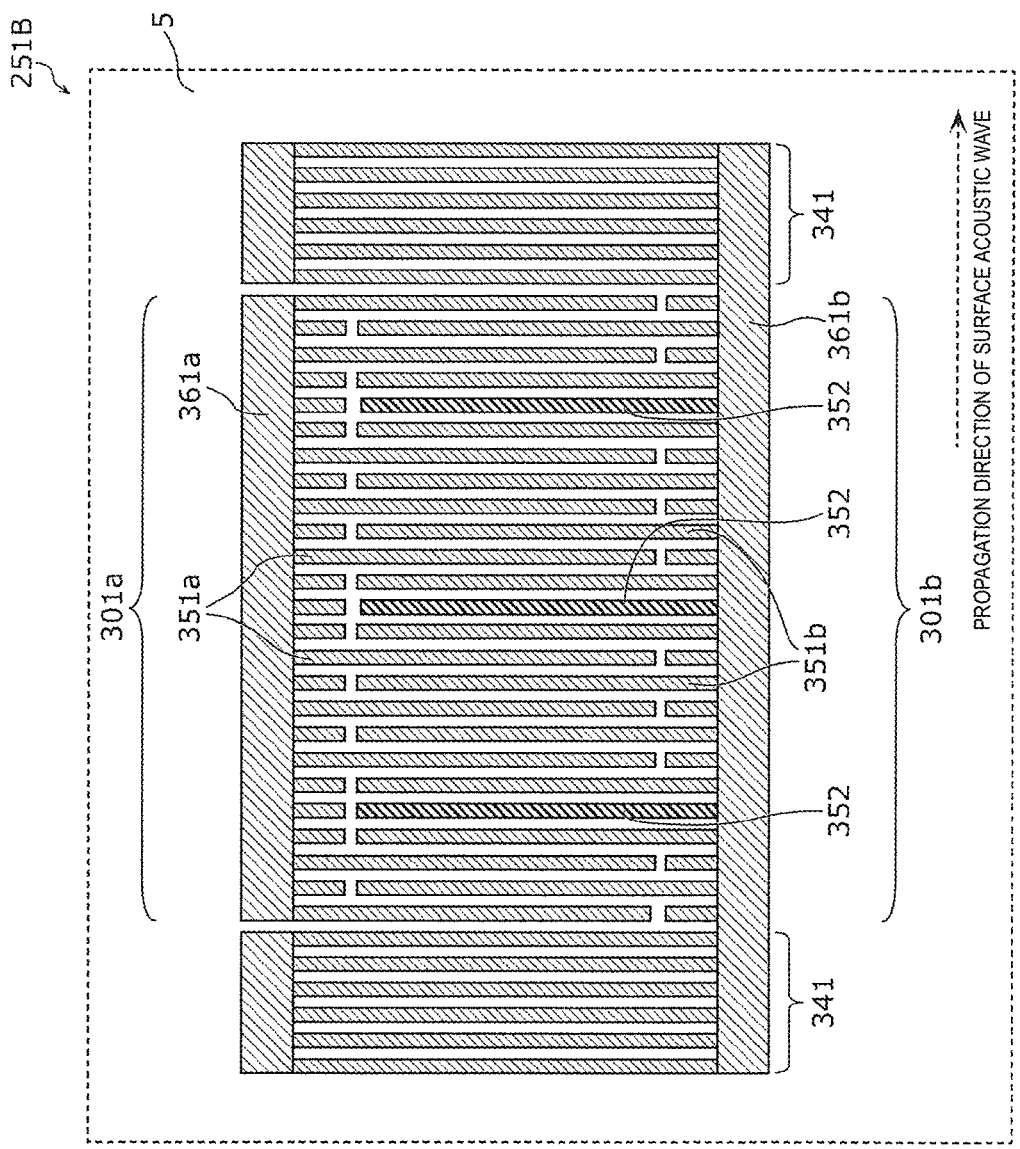

ACOUSTIC WAVE FILTER

CROSS REFERENCE TO RELATED APPLICATIONS

This application claims the benefit of priority to Japanese Patent Application No. 2018-152203 filed on Aug. 13, 2018 and is a Continuation Application of PCT Application No. PCT/JP2019/031014 filed on Aug. 6, 2019. The entire contents of each application are hereby incorporated herein by reference.

BACKGROUND OF THE INVENTION

1. Field of the Invention

The present invention relates to an acoustic wave filter.

2. Description of the Related Art

An acoustic wave filter has been put into practical use as a band filter used in an RF (Radio Frequency) circuit of a communication apparatus or the like. From a viewpoint of effectively utilizing frequency resources for wireless communication, a large number of frequency bands are allocated as communication bands for mobile phones and the like, and therefore the interval between adjacent frequency bands becomes narrow. In view of this allocation of the frequency band, in the acoustic wave filter, a change rate (hereinafter, referred to as steepness) of insertion loss from a pass band to an attenuation band in a pass band end portion is an important performance index.

Japanese Unexamined Patent Application Publication No. 2012-147175 discloses a ladder acoustic wave filter including an acoustic wave resonator having a small resonance fractional band width (a value obtained by dividing a frequency difference between an anti-resonant frequency and a resonant frequency by the center frequency of the anti-resonant frequency and the resonant frequency) in order to improve steepness at a pass band end portion. As a method of reducing the resonance fractional band width of an acoustic wave resonator, for example, it is known that a bridging capacitance element is added to the acoustic wave resonator or that the acoustic wave resonator includes an IDT (InterDigital Transducer) electrode subjected to withdrawal weighting.

However, for example, in a case where a bridging capacitance element is connected to a parallel arm resonator or a parallel arm resonator includes a withdrawal weighting electrode, return loss in the vicinity of the anti-resonant frequency of the parallel arm resonator deteriorates. In a ladder acoustic wave filter, since the anti-resonant frequency of the parallel arm resonator is normally disposed in the pass band, there is a problem that when the return loss at the anti-resonant frequency deteriorates, the insertion loss of the pass band of the acoustic wave filter deteriorates.

SUMMARY OF THE INVENTION

Preferred embodiments of the present invention provide ladder acoustic wave filters that each achieve both steepness of a pass band end portion and a low loss property of the pass band.

An acoustic wave filter according to a preferred embodiment of the present invention is a band pass acoustic wave filter having a pass band and an attenuation band on at least one of a lower-frequency side and a higher-frequency side than the pass band, the acoustic wave filter includes a first input/output terminal and a second input/output terminal; at least one serial arm resonance circuit on a path connecting the first input/output terminal and the second input/output terminal; and at least one parallel arm resonance circuit between a node on the path and a ground, in which each of the at least one serial arm resonance circuit and the at least one parallel arm resonance circuit includes an acoustic wave resonator, a first parallel arm resonance circuit of the at least one parallel arm resonance circuit further includes a bridging capacitance element connected in parallel to the acoustic wave resonator, an anti-resonant frequency of the first parallel arm resonance circuit is on the higher-frequency side than the pass band, and a resonant frequency of a first serial arm resonance circuit of the at least one serial arm resonance circuit is on a lower-frequency side than the anti-resonant frequency of the first parallel arm resonance circuit.

According to preferred embodiments of the present invention, it is possible to provide ladder acoustic wave filters that each achieve both steepness of a pass band end portion and a low loss property of the pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9B is a rough plan view illustrating a second example of the configuration of the IDT electrode of the parallel arm resonator of the acoustic wave filter according to Preferred Embodiment 2 of the present invention.

DETAILED DESCRIPTION OF THE PREFERRED EMBODIMENTS

Figure 1:
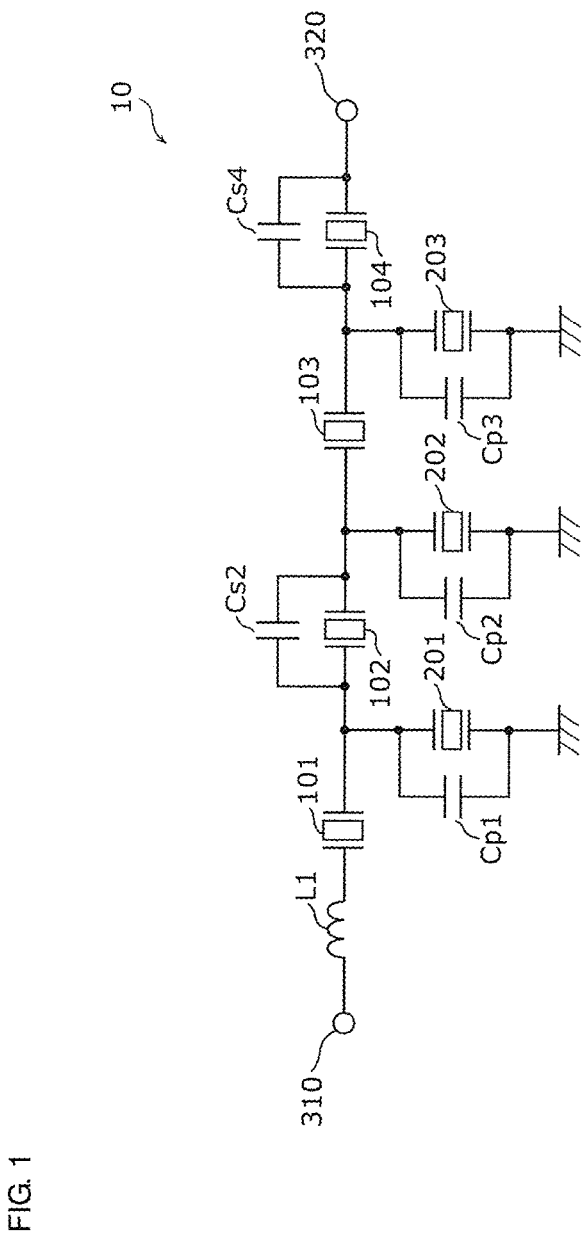
FIG. 1 is a circuit configuration diagram of an acoustic wave filter according to Preferred Embodiment 1 of the present invention.

Hereinafter, preferred embodiments of the present invention will be described in detail with reference to working examples and the drawings. Note that all preferred embodiments described below indicate comprehensive or specific examples. Numerical values, shapes, materials, elements, arrangement and connection structures of the elements, and the like, which will be described in the following preferred embodiments, are examples, and are not intended to limit the present invention. Elements which are not described in independent claims among the elements in the following preferred embodiments are described as arbitrary or optional elements. In addition, sizes or size ratios of the elements illustrated in the drawings are not necessarily strict.

Preferred Embodiment 1

1.1 Circuit Configuration of Acoustic Wave Filter

FIG. 1 is a circuit configuration diagram of an acoustic wave filter 10 according to Preferred Embodiment 1 of the present invention. As illustrated in FIG. 1, the acoustic wave filter 10 includes serial arm resonators 101, 102, 103, and 104, parallel arm resonators 201, 202, and 203, bridging capacitances Cs2 and Cs4, an inductor L1, and input/output terminals 310 and 320.

The serial arm resonators 101 to 104 are disposed on a path connecting the input/output terminal 310 (first input/output terminal) and the input/output terminal 320 (second input/output terminal), and are connected in series to each other. Furthermore, the parallel arm resonators 201 to 203 are each disposed between a node on the path and a ground terminal. With the above-described connection configuration of the serial arm resonators 101 to 104 and the parallel arm resonators 201 to 203, the acoustic wave filter 10 defines a ladder band pass filter.

The bridging capacitance Cs2 connected in parallel to the input/output ends of the serial arm resonator 102 is added to the serial arm resonator 102. Furthermore, the bridging capacitance Cs4 connected in parallel to the input/output ends of the serial arm resonator 104 is added to the serial arm resonator 104.

A bridging capacitance Cp1 connected in parallel to the input/output ends of the parallel arm resonator 201 is added to the parallel arm resonator 201. A bridging capacitance Cp2 connected in parallel to the input/output ends of the parallel arm resonator 202 is added to the parallel arm resonator 202. A bridging capacitance Cp3 connected in parallel to the input/output ends of the parallel arm resonator 203 is added to the parallel arm resonator 203.

One or more serial arm resonance circuits are disposed on the path connecting the input/output terminal 310 and the input/output terminal 320. The serial arm resonator 101, a circuit in which the serial arm resonator 102 and the bridging capacitance Cs2 are connected in parallel, the serial arm resonator 103, and a circuit in which the serial arm resonator 104 and the bridging capacitance Cs4 are connected in parallel respectively define serial arm resonance circuits. The serial arm resonance circuit includes a serial arm resonator.

Furthermore, a circuit in which the parallel arm resonator 201 and the bridging capacitance Cp1 are connected in parallel, a circuit in which the parallel arm resonator 202 and the bridging capacitance Cp2 are connected in parallel, and a circuit in which the parallel arm resonator 203 and the bridging capacitance Cp3 are connected in parallel respectively define parallel arm resonance circuits each disposed between the node on the path and the ground. The parallel arm resonance circuit includes a parallel arm resonator.

The inductor L1 is an inductance element providing impedance matching that is disposed in series between the input/output terminal 310 and the serial arm resonator 101.

With the above-described configuration, the acoustic wave filter 10 defines and functions as a band pass filter having a pass band and an attenuation band on at least one of a lower-frequency side and a higher-frequency side than the pass band.

Note that the ground terminals to which the parallel arm resonators 201 to 203 are respectively connected may be shared on a substrate on which the parallel arm resonators 201 to 203 are provided or may be individually provided on the substrate, and are arbitrarily set from the viewpoint of adjusting an attenuation pole of the acoustic wave filter 10.

Figure 2A:
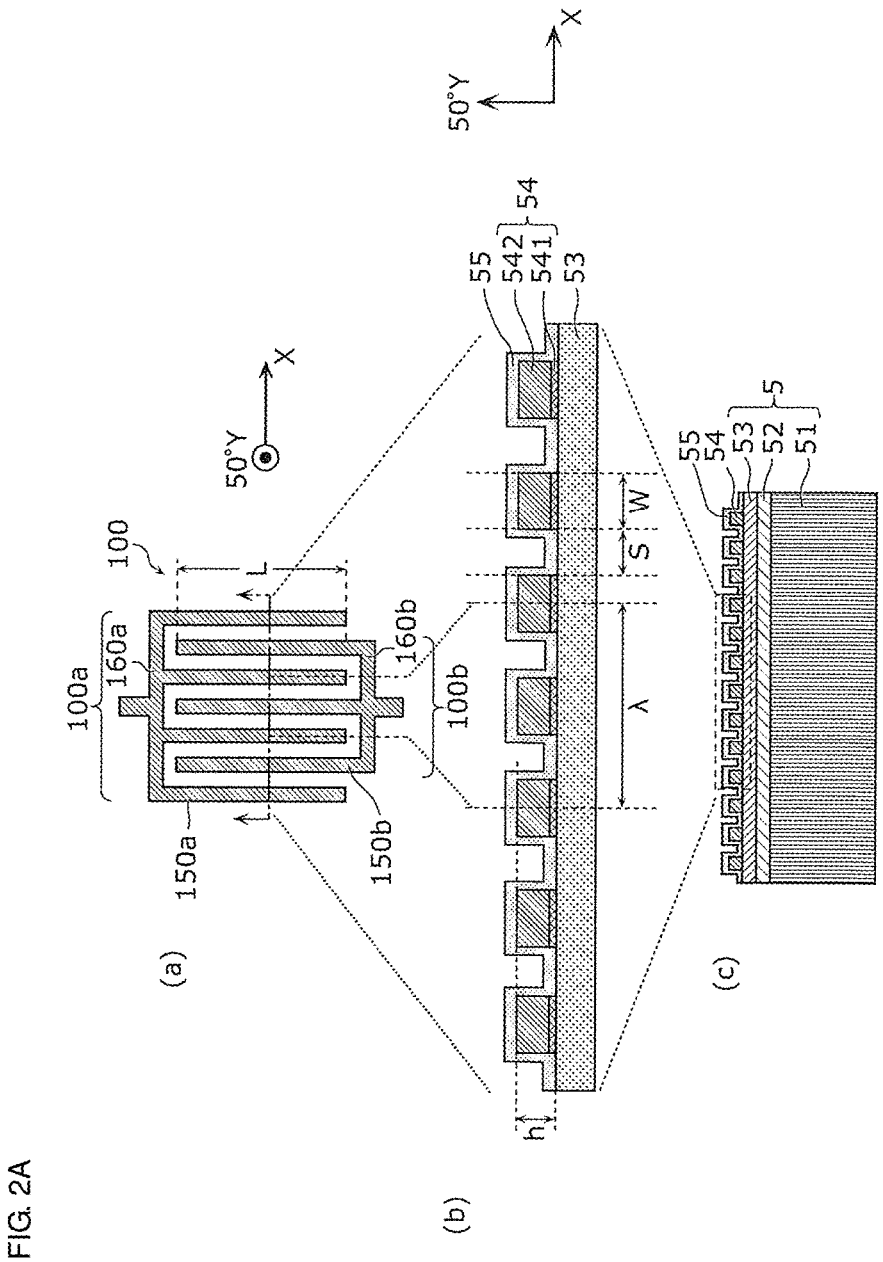
FIG. 2A includes a plan view and a cross-sectional view schematically illustrating an example of the acoustic wave resonator according to Preferred Embodiment 1 of the present invention.

The bridging capacitances Cs2, Cs4, and Cp1 to Cp3 may each be, for example, a capacitance element including a pair of comb-shaped electrodes as illustrated in FIG. 2A, which will be described later, or may each be a capacitance element such as a chip capacitor, for example, and may each be a capacitance element defined by a wiring connecting an acoustic wave resonator and a dielectric material, such as a substrate.

Additionally, the bridging capacitances Cs2 and Cs4 may not be provided. In addition, it is sufficient that at least one of the bridging capacitances Cp1 to Cp3 is provided.

Furthermore, the number of serial arm resonators of the acoustic wave filter 10 is not limited to four as illustrated in FIG. 1, and it is sufficient that the number is equal to or greater than one. Furthermore, the number of parallel arm resonators of the acoustic wave filter 10 is not limited to three as illustrated in FIG. 1, and it is sufficient that the number is equal to or greater than one. Additionally, the inductor L1 may not be provided.

Furthermore, a circuit element such as an inductor, a capacitor, or the like, or a longitudinally coupled resonator, and the like, for example, may be inserted between the serial arm resonators 101 to 104, the parallel arm resonators 201 to 203, and the input/output terminals 310 and 320.

A basic structure of the serial arm resonator and the parallel arm resonator of the acoustic wave filter 10 will be described below.

1.2 Structure of Acoustic Wave Resonator

FIG. 2A is a schematic diagram schematically illustrating an example of the acoustic wave resonator according to Preferred Embodiment 1, and part (a) is a plan view and parts (b) and (c) are cross-sectional views taken along the dot-dash line illustrated in part (a). FIG. 2A illustrates, as an example, an acoustic wave resonator 100 having a basic structure of the serial arm resonators 101 to 104 and the parallel arm resonators 201 to 203 of the acoustic wave filter 10. Note that the acoustic wave resonator 100 illustrated in FIG. 2A is illustrated for describing a typical structure of an acoustic wave resonator, and the number, the lengths, and the like of electrode fingers of the electrode are not limited thereto.

The acoustic wave resonator 100 includes a substrate 5 having piezoelectricity and comb-shaped electrodes 100a and 100b.

As illustrated in part (a) of FIG. 2A, a pair of the comb-shaped electrodes 100a and 100b facing each other are provided on the substrate 5. The comb-shaped electrode 100a includes a plurality of electrode fingers 150a that are parallel or substantially parallel to one another, and a busbar electrode 160a that connects the plurality of electrode fingers 150a. Furthermore, the comb-shaped electrode 100b includes a plurality of electrode fingers 150b that are parallel or substantially parallel to one another, and a busbar electrode 160b that connects the plurality of electrode fingers 150b. The plurality of electrode fingers 150a and 150b extend along a direction orthogonal or substantially orthogonal to an acoustic wave propagation direction (X-axis direction).

Furthermore, an IDT (InterDigital Transducer) electrode 54 including the plurality of electrode fingers 150a and 150b and the busbar electrodes 160a and 160b has a laminated structure including a close contact layer 541 and a main electrode layer 542 as illustrated in part (b) of FIG. 2A.

The close contact layer 541 improves a close contact property between the substrate 5 and the main electrode layer 542, and, for example, Ti is preferably used as a material. The film thickness of the close contact layer 541 is preferably, for example, about 12 nm.

For the main electrode layer 542, for example, Al containing about 1% of Cu is preferably used. The film thickness of the main electrode layer 542 is preferably, for example, about 162 nm.

A protective layer 55 covers the comb-shaped electrodes 100a and 100b. The protective layer 55 protects the main electrode layer 542 from the external environment, adjusts frequency temperature characteristics, improves moisture resistance, and the like, and is preferably, for example, a dielectric film including silicon dioxide as a main component. The thickness of the protective layer 55 is preferably, for example, about 25 nm.

Note that the materials used for the close contact layer 541, the main electrode layer 542, and the protective layer 55 are not limited to the above-described materials. Furthermore, the IDT electrode 54 may not have the above-described laminated structure. The IDT electrode 54 may preferably be made of, for example, a metal such as Ti, Al, Cu, Pt, Au, Ag, Pd, or the like, or an alloy thereof, or may include a plurality of multilayer bodies made of the metal or the alloy described above. In addition, the protective layer 55 may not be provided.

Next, a laminated structure of the substrate 5 will be described.

As illustrated in part (c) of FIG. 2A, the substrate 5 includes a high acoustic velocity support substrate 51, a low acoustic velocity film 52, and a piezoelectric film 53, and has a structure in which the high acoustic velocity support substrate 51, the low acoustic velocity film 52, and the piezoelectric film 53 are laminated in this order.

The piezoelectric film 53 is preferably made of, for example, a 50° Y-cut X-propagation $LiTaO_3$ piezoelectric single crystal or piezoelectric ceramics (a lithium tantalate single crystal obtained by cutting along a surface which takes, as a normal line, an axis rotated by about 50° from the Y-axis with an X-axis as the center axis, or ceramics, the single crystal or the ceramics in which a surface acoustic wave propagates in the X-axis direction). The piezoelectric film 53 preferably has, for example, a thickness of about 600 nm. Note that depending on the required specifications of the respective filters, the material and the cut-angles of the piezoelectric single crystal to be used as the piezoelectric film 53 are appropriately selected.

The high acoustic velocity support substrate 51 supports the low acoustic velocity film 52, the piezoelectric film 53, and the IDT electrode 54. Furthermore, the high acoustic velocity support substrate 51 is a substrate in which the acoustic velocity of a bulk wave in the high acoustic velocity support substrate 51 is higher than that of an acoustic wave such as a surface acoustic wave, a boundary wave, and the like, for example, propagating in the piezoelectric film 53, and confines the surface acoustic wave in a portion where the piezoelectric film 53 and the low acoustic velocity film 52 are laminated, and prevents it from leaking below the high acoustic velocity support substrate 51. The high acoustic velocity support substrate 51 is preferably, for example, a silicon substrate, and a thickness thereof is preferably, for example, about 200 μm.

The low acoustic velocity film 52 is a film in which the acoustic velocity of a bulk wave in the low acoustic velocity film is lower than that of a bulk wave propagating in the piezoelectric film 53, and is disposed between the piezoelectric film 53 and the high acoustic velocity support substrate 51. This structure and a property that the energy of the acoustic wave is inherently concentrated on a medium having low acoustic velocity reduce or prevent leakage of the surface acoustic wave energy to the outside of the IDT electrode. The low acoustic velocity film 52 is preferably, for example, a film including silicon dioxide as a main component, and the thickness thereof is preferably, for example, about 670 nm.

Note that the above-described laminated structure of the substrate 5 can significantly increase the Q value at the resonant frequency and the anti-resonant frequency as compared to the existing structure in which the piezoelectric substrate including a single layer is used. That is, since an acoustic wave resonator having a high Q value can be provided, it is possible to configure a filter having small insertion loss by using the acoustic wave resonator.

Furthermore, in order to improve the steepness of the pass band low-frequency side end portion and high-frequency side end portion of the acoustic wave filter 10, when a bridging capacitance is connected to the acoustic wave resonator, or when a withdrawal electrode is included in the acoustic wave resonator as will be described later, a case in which the Q value of the acoustic wave resonance circuit (or the acoustic wave resonator) is equivalently reduced is assumed. On the other hand, according to the laminated structure of the substrate, the Q value of the acoustic wave resonator 100 can be maintained at a high value. Accordingly, it is possible to provide the acoustic wave filter 10 in which low loss in the pass band is maintained.

Note that the high acoustic velocity support substrate 51 may have a structure in which a support substrate, and a high acoustic velocity film in which the acoustic velocity of a bulk wave propagating therein is higher than that of an acoustic wave such as a surface acoustic wave, a boundary wave, or the like, for example, propagating in the piezoelectric film 53 are laminated. In this case, for the support substrate, it is possible to use, for example, a piezoelectric material such as sapphire, lithium tantalate, lithium niobate, crystal, or the like, various types of ceramics including alumina, magnesia, silicon nitride, aluminum nitride, silicon carbide, zirconia, cordierite, mullite, steatite, forsterite, or the like, a dielectric material such as glass, or the like, a semiconductor such as silicon, gallium nitride, or the like, a resin substrate, and the like. Furthermore, for the high acoustic velocity film, it is possible to use, for example, various high acoustic velocity materials such as aluminum nitride, aluminum oxide, silicon carbide, silicon nitride, silicon oxynitride, a DLC film, diamond, a medium containing any of these materials as a main component, a medium containing a mixture of these materials as a main component, and the like.

Figure 2B:
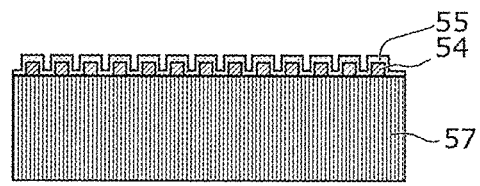
FIG. 2B is a cross-sectional view schematically illustrating an acoustic wave resonator according to a modification of Preferred Embodiment 1 of the present invention.

FIG. 2B is a cross-sectional view schematically illustrating an acoustic wave resonator according to a modification of Preferred Embodiment 1. In the acoustic wave resonator 100 illustrated in FIG. 2A, an example in which the IDT electrode 54 is provided on the substrate 5 including the piezoelectric film 53 has been described, but the substrate on which the IDT electrode 54 is provided may be a piezoelectric single crystal substrate 57 including a single layer of a piezoelectric layer as illustrated in FIG. 2B. The piezoelectric single crystal substrate 57 is preferably made of, for example, a piezoelectric single crystal of $LiNbO_3$. The acoustic wave resonator 100 according to the present modification includes the piezoelectric single crystal substrate 57 of $LiNbO_3$, the IDT electrode 54, and the protective layer 55 provided on the piezoelectric single crystal substrate 57 and on the IDT electrode 54.

In the piezoelectric film 53 and the piezoelectric single crystal substrate 57 described above, the laminated structure, the material, the cut-angles, and the thickness may be appropriately changed in accordance with required bandpass characteristics and the like of the acoustic wave filter device. Even in the acoustic wave resonator 100 including an $LiTaO_3$ piezoelectric substrate or the like having cut-angles other than the cut-angles described above, the same or substantially the same advantageous effects as those of the acoustic wave resonator 100 using the piezoelectric film 53 described above can be obtained.

Furthermore, the substrate on which the IDT electrode 54 is provided may have a structure in which a support substrate, an energy confinement layer, and a piezoelectric film are laminated in this order. The IDT electrode 54 is provided on the piezoelectric film. For the piezoelectric film, for example, a $LiTaO_3$ piezoelectric single crystal or piezoelectric ceramics are preferably used. The support substrate supports the piezoelectric film, the energy confinement layer, and the IDT electrode 54.

The energy confinement layer includes one layer or a plurality of layers, and the velocity of the acoustic bulk wave propagating in at least one layer thereof is higher than the velocity of the acoustic wave propagating in the vicinity of the piezoelectric film. For example, a laminated structure including a low acoustic velocity layer and a high acoustic velocity layer may be provided. The low acoustic velocity layer is a film in which the acoustic velocity of a bulk wave in the low acoustic velocity layer is lower than the acoustic velocity of an acoustic wave propagating in the piezoelectric film. The high acoustic velocity layer is a film in which the acoustic velocity of a bulk wave in the high acoustic velocity layer is higher than the acoustic velocity of an acoustic wave propagating in the piezoelectric film. Note that the support substrate may be used as the high acoustic velocity layer.

Furthermore, the energy confinement layer may be an acoustic impedance layer having a configuration in which a low acoustic impedance layer having a relatively low acoustic impedance and a high acoustic impedance layer having a relatively high acoustic impedance are alternately laminated.

Here, an example (working example) of electrode parameters of the IDT electrode of the acoustic wave resonator 100 will be described.

A wavelength of the acoustic wave resonator is defined by a wavelength λ which is a repetition period of the plurality of electrode fingers 150a or 150b of the IDT electrode 54 illustrated in FIG. 2A(b). Furthermore, an electrode pitch is ½ of the wavelength λ, and is defined as (W+S), in a case where a line width of each of the electrode fingers 150a and 150b of the comb-shaped electrodes 100a and 100b is taken as W, and a space width between the electrode finger 150a and the electrode finger 150b which are adjacent to each other is taken as S. Furthermore, an intersecting width L of the pair of comb-shaped electrodes 100a and 100b is, as illustrated in part (a) of FIG. 2A, an overlapping electrode finger length of the electrode finger 150a and the electrode finger 150b when viewed from the acoustic wave propagation direction (X-axis direction). Furthermore, an electrode duty of each acoustic wave resonator is a line width occupancy ratio of the plurality of electrode fingers 150a and 150b, and is a ratio of the line width to a value obtained by adding the line width and the space width of the plurality of electrode fingers 150a and 150b, and is defined by W/(W+S). Furthermore, the height of the comb-shaped electrodes 100a and 100b are defined as h. Hereinafter, parameters related to the shape of the IDT electrode of the acoustic wave resonator, such as the wavelength λ, the intersecting width L, the electrode duty, the height h of the IDT electrode 54, and the like, for example, are referred to as electrode parameters.

1.3 Operation Principle of Acoustic Wave Filter

Next, an operation principle of a ladder acoustic wave filter according to Preferred Embodiment 1 will be described.

Figure 3:
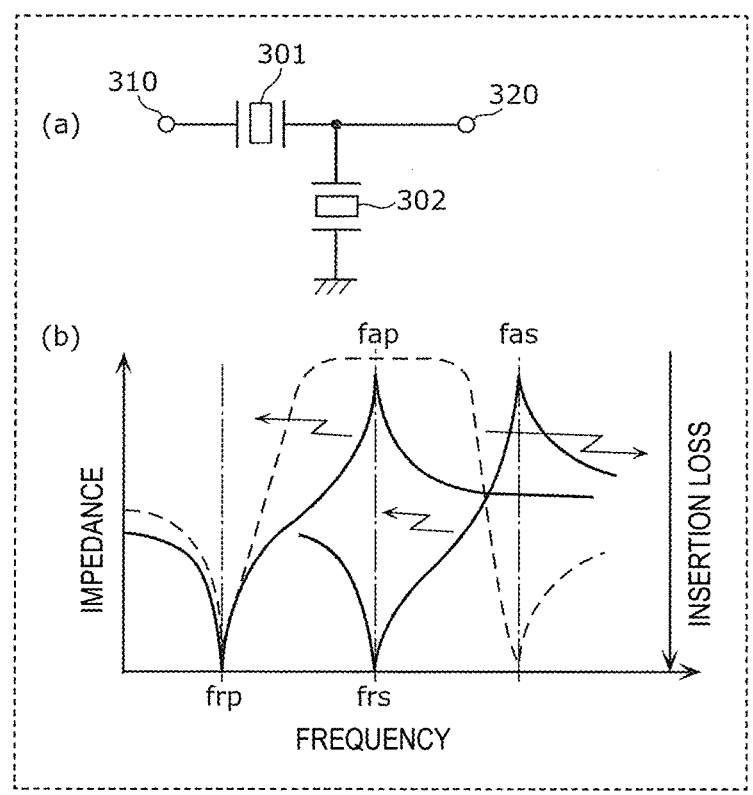
FIG. 3 includes a circuit configuration diagram illustrating a basic operation principle and a graph showing frequency characteristics of a ladder acoustic wave filter.

FIG. 3 includes a circuit configuration diagram illustrating a basic operation principle and a graph showing frequency characteristics of a ladder acoustic wave filter.

The acoustic wave filter illustrated in part (a) of FIG. 3 is a basic ladder filter including one serial arm resonator 301 and one parallel arm resonator 302. As illustrated in part (a) of FIG. 3, the parallel arm resonator 302 has a resonant frequency frp and an anti-resonant frequency fap (>frp) in resonance characteristics. Additionally, the serial arm resonator 301 has a resonant frequency frs and an anti-resonant frequency fas (>frs>frp) in resonance characteristics.

When a band pass filter is provided using the ladder acoustic wave resonator, in general, the anti-resonant frequency fap of the parallel arm resonator 302 and the resonant frequency frs of the serial arm resonator 301 are brought close to each other. With this configuration, a low-frequency side stop band is provided in the vicinity of the resonant frequency frp at which the impedance of the parallel arm resonator 302 approaches zero. Furthermore, as the frequency increases from this point, the impedance of the parallel arm resonator 302 increases in the vicinity of the anti-resonant frequency fap, and the impedance of the serial arm resonator 301 approaches zero in the vicinity of the resonant frequency frs. As a result, in the vicinity of a range from the anti-resonant frequency fap to the resonant frequency frs, a signal pass band is provided in a signal path from the input/output terminal 310 to the input/output terminal 320. This makes it possible to provide a pass band that reflects the electrode parameters and the electromechanical coupling coefficient of the acoustic wave resonator. As the frequency further increases and approaches the vicinity of the anti-resonant frequency fas, impedance of the serial arm resonator 301 increases, and a high-frequency side stop band is provided.

As compared to the basic operation principle described above, in the acoustic wave filter 10 according to Preferred Embodiment 1, resonant frequencies Frs of at least some of the serial arm resonance circuits are made lower than anti-resonant frequencies Fap of some of the parallel arm resonance circuits to each of which the bridging capacitance is added. This makes it possible to narrow the pass band of the acoustic wave filter 10.

Note that the number of stages of resonance stages of the parallel arm resonators and the serial arm resonators is appropriately selected in accordance with the required specifications. In general, in the case where the acoustic wave filter includes a plurality of resonance stages, the anti-resonant frequencies fap of the plurality of parallel arm resonators coincide or substantially coincide with one another, and the anti-resonant frequencies fas of the plurality of serial arm resonators coincide or substantially coincide with one another.

In the acoustic wave filter having the above-described operation principle, when a high-frequency signal is input from the input/output terminal 310, a potential difference is generated between the input/output terminal 310 and a reference terminal, such that the piezoelectric layer is distorted and therefore a surface acoustic wave propagating in the X-axis direction is generated. Here, by making the wavelength λ of the IDT electrode 54 and the wavelength of the pass band coincide or substantially coincide with each other, only a high-frequency signal having a frequency component desired to be allowed to pass therethrough passes through the acoustic wave filter.

1.4 Bandpass Characteristics of Acoustic Wave Filter

Next, impedance characteristics and reflection characteristics of the acoustic wave resonator according to Preferred Embodiment 1 and bandpass characteristics of the acoustic wave filter 10 will be described.

Figure 4:
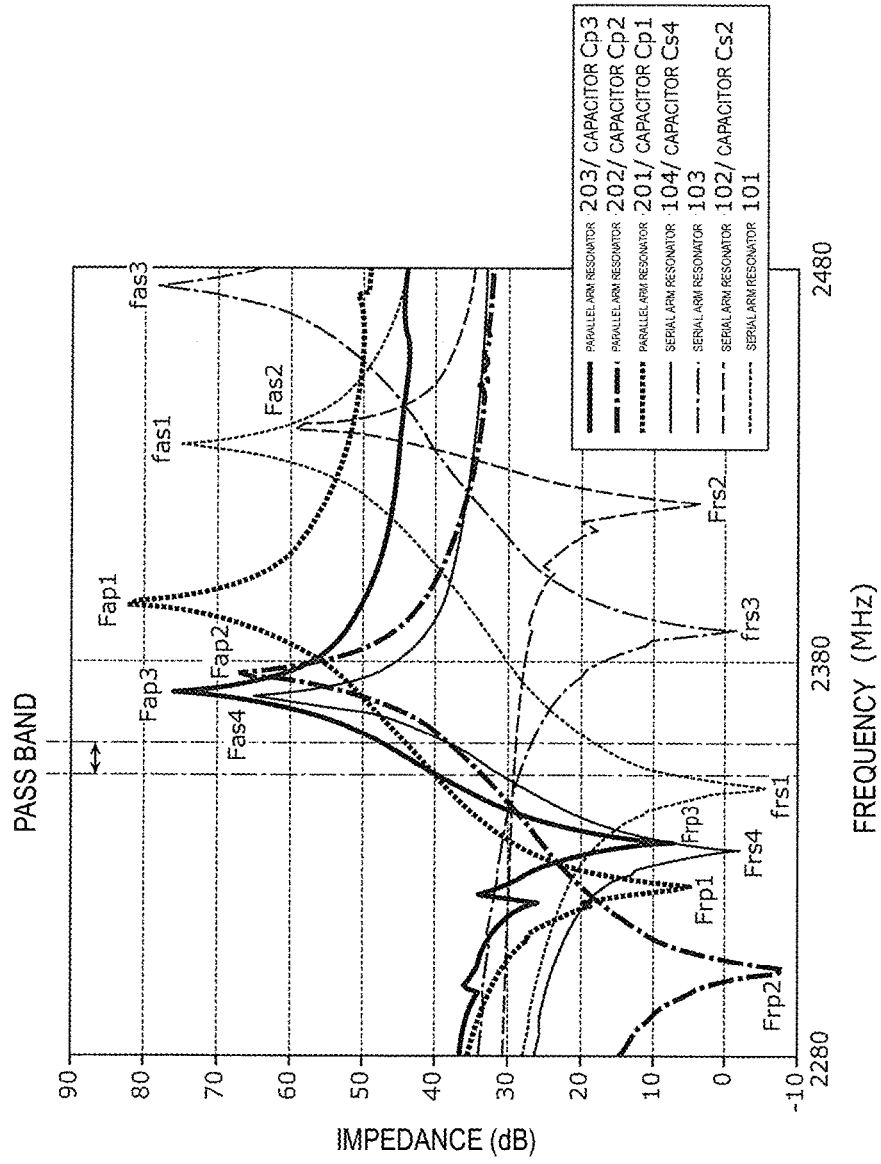
FIG. 4 is a graph showing impedance characteristics of each acoustic wave resonator of an acoustic wave filter according to Working Example 1.
Figure 5:
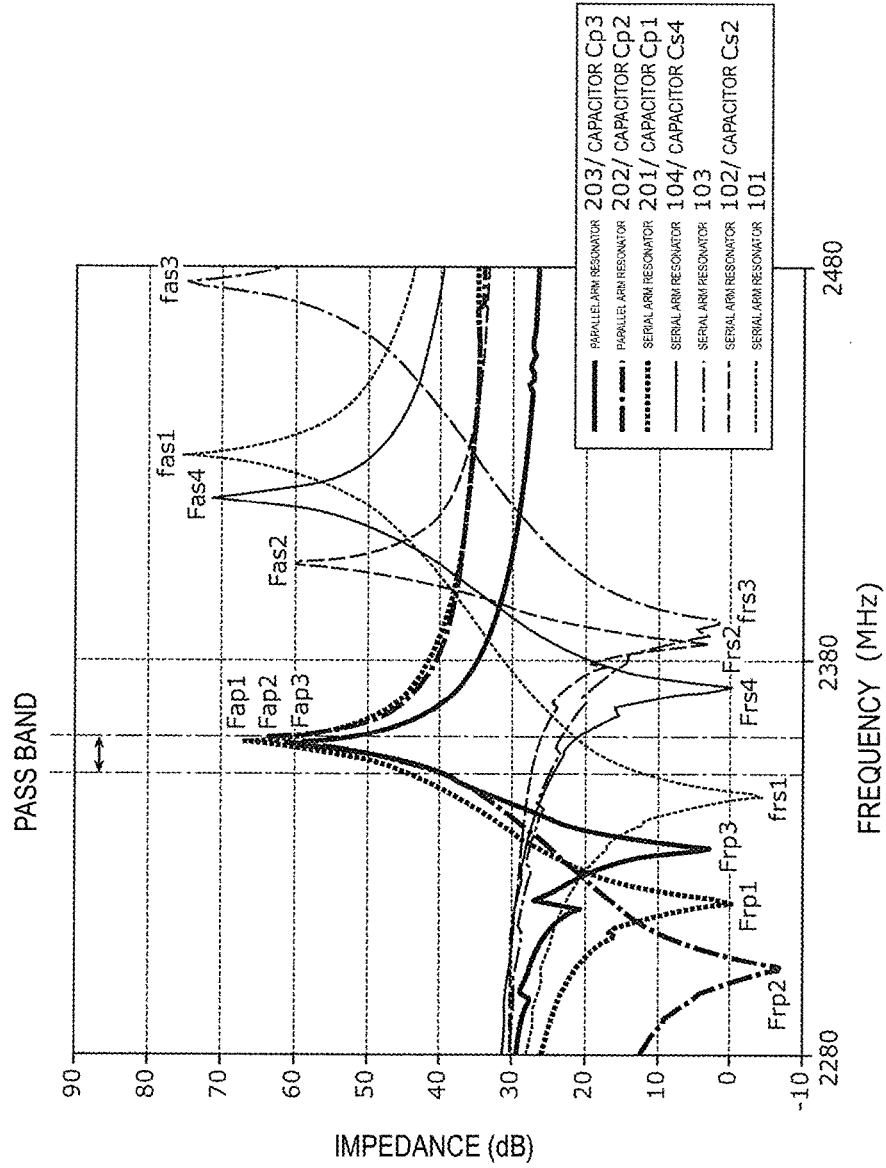
FIG. 5 is a graph showing impedance characteristics of each acoustic wave resonator of an acoustic wave filter according to a comparative example.

FIG. 4 is a graph showing impedance characteristics of each acoustic wave resonator of the acoustic wave filter 10 according to Working Example 1. Furthermore, FIG. 5 is a graph showing impedance characteristics of each acoustic wave resonator of an acoustic wave filter according to a comparative example.

Here, the acoustic wave filter 10 according to Working Example 1 has the circuit configuration of the acoustic wave filter 10 according to Preferred Embodiment 1 illustrated in FIG. 1, and anti-resonant frequencies of the parallel arm resonance circuits and resonant frequencies of the serial arm resonance circuits, and specific numerical values of the bridging capacitances are as shown in Table 1. Note that although not shown in Table 1, the inductance value of the inductor L1 is preferably about 4.0 nH, for example.

The acoustic wave filter 10 according to Working Example is applied as, for example, a reception filter for Band 30 (reception band: about 2350 MHz to about 2360 MHz) of LTE (Long Term Evolution). Band 30 has a reception band whose band width is about 10 MHz, has an attenuation band of the SDARS band (Satellite Digital Audio Radio Service: about 2336.2 MHz to about 2341.3 MHz) on the lower-frequency side than the pass band, and is required to be a narrow band and to have a high steepness at the pass band low-frequency side end portion.

Furthermore, although the acoustic wave filter according to the comparative example has the circuit configuration of the acoustic wave filter 10 illustrated in FIG. 1, anti-resonant frequencies of the parallel arm resonance circuits and resonant frequencies of the serial arm resonance circuits, and specific numerical values of the bridging capacitances are different from those of the acoustic wave filter 10 according to Working Example 1 as shown in Table 1.

TABLE 1

|  |  | SERIAL ARM RESONANCE CIRCUIT (RESONATOR 101) | SERIAL ARM RESONANCE CIRCUIT (RESONATOR 102 + CAPACITANCE Cs2) | SERIAL ARM RESONANCE CIRCUIT (RESONATOR 103) | SERIAL ARM RESONANCE CIRCUIT (RESONATOR 104 + CAPACITANCE Cs4) |
|---|---|---|---|---|---|
| WORKING EXAMPLE 1 | BRIDGING CAPACITANCE (pF) | — | 1.4 | — | 1.0 |
|  | RESONANT FREQUENCY (MHz) | 2348 | 2420 | 2388 | 2332 |
| COMPARATIVE EXAMPLE | BRIDGING CAPACITANCE (pF) | — | 1.4 | — | 0.6 |
|  | RESONANT FREQUENCY (MHz) | 2345 | 2384 | 2386 | 2373 |

|  |  | PARALLEL ARM RESONANCE CIRCUIT (RESONATOR 201 + CAPACITANCE Cp1) | PARALLEL ARM RESONANCE CIRCUIT (RESONATOR 202 + CAPACITANCE Cp2) | PARALLEL ARM RESONANCE CIRCUIT (RESONATOR 203 + CAPACITANCE Cp3) |
|---|---|---|---|---|
| WORKING EXAMPLE 1 | BRIDGING CAPACITANCE (pF) | 0.1 | 0.4 | 0.3 |
|  | ANTI-RESONANT FREQUENCY (MHz) | 2394 | 2377 | 2372 |
| COMPARATIVE | BRIDGING | 0.9 | 1.5 | 1.0 |

TABLE 1-continued

| EXAMPLE | CAPACITANCE (pF) | | | |
|---|---|---|---|---|
| | ANTI-RESONANT FREQUENCY (MHz) | 2359 | 2357 | 2360 |

In the acoustic wave filter according to the comparative example, as illustrated in FIG. 5, an anti-resonant frequency Fap1 of the parallel arm resonance circuit (resonant frequency Frp1, anti-resonant frequency Fap1) in which the parallel arm resonator 201 and the bridging capacitance Cp1 are connected in parallel, an anti-resonant frequency Fap2 of the parallel arm resonance circuit (resonant frequency Frp2, anti-resonant frequency Fap2) in which the parallel arm resonator 202 and the bridging capacitance Cp2 are connected in parallel, and an anti-resonant frequency Fap3 of the parallel arm resonance circuit (resonant frequency Frp3, anti-resonant frequency Fap3) in which the parallel arm resonator 203 and the bridging capacitance Cp3 are connected in parallel are all positioned in the pass band. In addition, a resonant frequency frs1 of the serial arm resonance circuit (resonant frequency frs1, anti-resonant frequency fas1) of the serial arm resonator 101 is positioned on the lower-frequency side than the anti-resonant frequencies Fap1, Fap2, and Fap3 of the above-described parallel arm resonance circuits.

According to the above-described configuration of the acoustic wave filter according to the comparative example, the bridging capacitances Cp1, Cp2, and Cp3 are respectively added to the parallel arm resonators 201, 202, and 203, such that parallel arm resonance circuits each having a small resonance fractional band width are provided. This makes it possible to improve the steepness at the pass band low-frequency side end portion of the ladder acoustic wave filter.

Figure 6A:
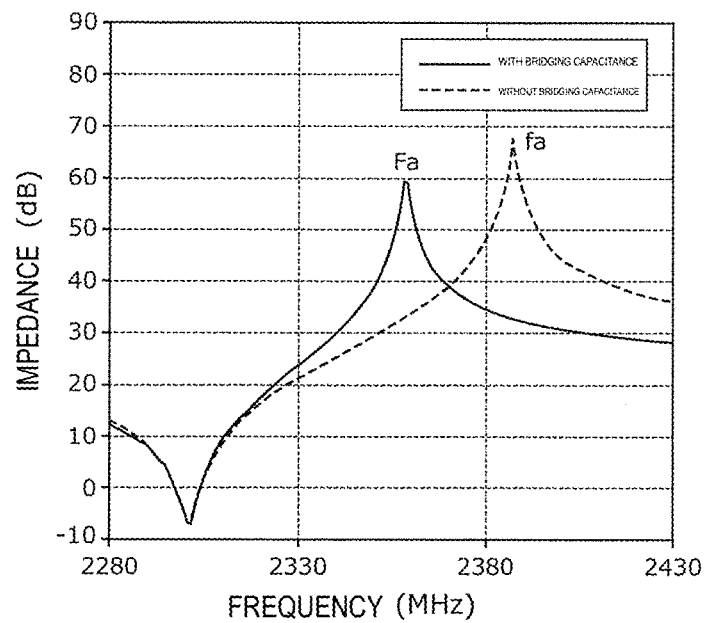
FIG. 6A is a graph comparing impedance characteristics of acoustic wave resonance circuits with and without a bridging capacitance element.

FIG. 6A is a graph comparing impedance characteristics of acoustic wave resonance circuits with and without a bridging capacitance. In the graph, impedance of the acoustic wave resonator alone (broken line in FIG. 6A) and impedance of the acoustic wave resonance circuit in which the bridging capacitance is added to the acoustic wave resonator (solid line in FIG. 6A) are shown. As shown in the graph, since an anti-resonant frequency Fa of the acoustic wave resonance circuit to which the bridging capacitance is added shifts to the low-frequency side relative to an anti-resonant frequency fa of the acoustic wave resonator alone, the resonance fractional band width can be reduced, but the impedance of the anti-resonant frequency Fa becomes smaller than the impedance of the anti-resonant frequency fa.

Figure 6B:
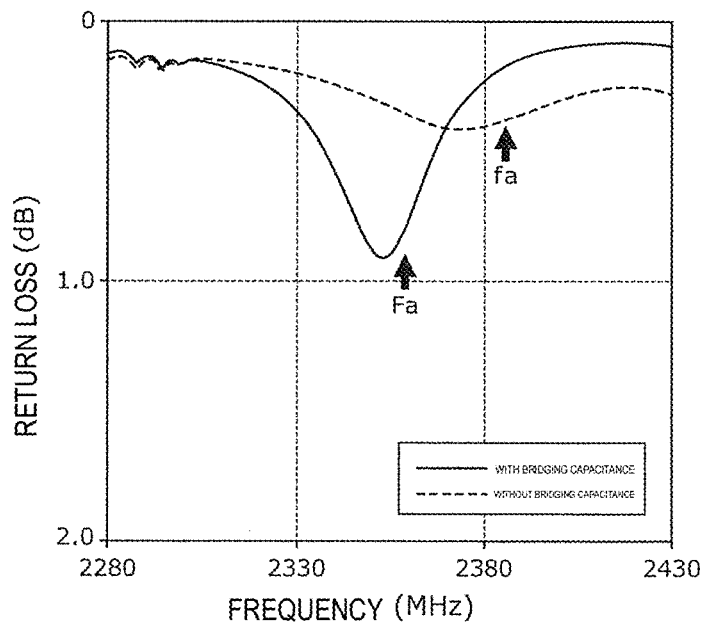
FIG. 6B is a graph comparing reflection characteristics of the acoustic wave resonance circuits with and without the bridging capacitance element.

FIG. 6B is a graph comparing reflection characteristics of the acoustic wave resonance circuits with and without the bridging capacitance. In response to the change in the impedance characteristics shown in FIG. 6A, return loss in the vicinity of the anti-resonant frequency Fa of the acoustic wave resonance circuit in which the bridging capacitance is added to the acoustic wave resonator is larger than return loss in the vicinity of the anti-resonant frequency fa of the acoustic wave resonator alone.

In the acoustic wave filter according to the comparative example, the anti-resonant frequency Fap of the parallel arm resonance circuit to which the bridging capacitance is added in parallel is, referring to FIG. 6A, shifted to the low-frequency side relative to the anti-resonant frequency fap of the parallel arm resonator alone, and thus it is possible to reduce the resonance fractional band width. However, referring to FIG. 6B, the return loss in the vicinity of the anti-resonant frequency Fap increases in response to the impedance reduction in the vicinity of the anti-resonant frequency Fap. In the acoustic wave filter according to the comparative example, since all of the anti-resonant frequencies Fap1 to Fap3 each having large return loss are positioned within the pass band, insertion loss of the pass band is deteriorated due to an increase in return loss in the vicinity of the anti-resonant frequencies Fap1 to Fap3.

In contrast, in the acoustic wave filter 10 according to Working Example 1, the anti-resonant frequency Fap1 of the parallel arm resonance circuit in which the parallel arm resonator 201 and the bridging capacitance Cp1 are connected in parallel, the anti-resonant frequency Fap2 of the parallel arm resonance circuit in which the parallel arm resonator 202 and the bridging capacitance Cp2 are connected in parallel, and the anti-resonant frequency Fap3 of the parallel arm resonance circuit (first parallel arm resonance circuit) in which the parallel arm resonator 203 and the bridging capacitance Cp3 are connected in parallel are all positioned on the higher-frequency side than the pass band. In addition, the resonant frequency frs1 of the serial arm resonance circuit (first serial arm resonance circuit) of the serial arm resonator 101 is positioned on the lower-frequency side than the anti-resonant frequencies Fap1, Fap2, and Fap3 of the above-described parallel arm resonance circuits.

Figure 7:
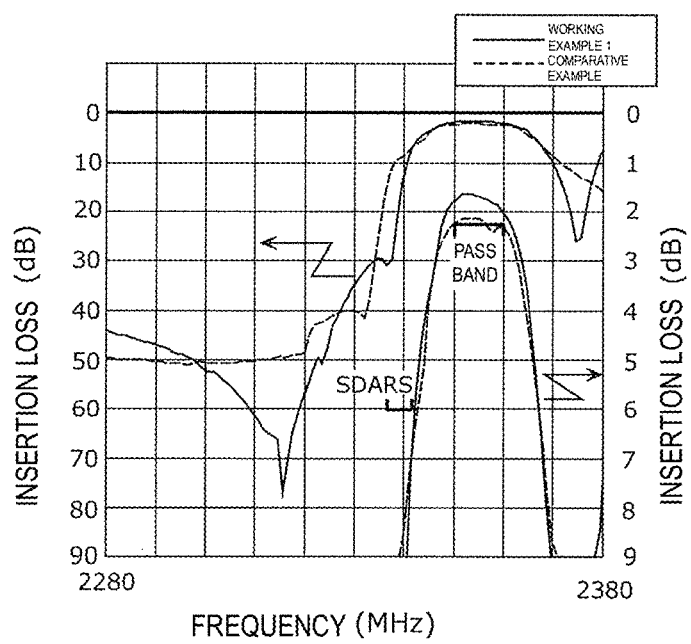
FIG. 7 is a graph comparing bandpass characteristics of the acoustic wave filters according to Working Example 1 and the comparative example.

FIG. 7 is a graph comparing bandpass characteristics of the acoustic wave filters according to Working Example 1 and the comparative example. As shown in FIG. 7, with the acoustic wave filter 10 according to Working Example 1, the bridging capacitances Cp1, Cp2, and Cp3 are respectively added to the parallel arm resonators 201, 202, and 203, such that parallel arm resonance circuits each having a small resonance fractional band width are provided. This makes it possible to improve the steepness at the pass band low-frequency side end portion of the ladder acoustic wave filter 10. Furthermore, since the anti-resonant frequencies Fap1 to Fap3 of the parallel arm resonance circuits to each of which the bridging capacitance is added and each of which has a large return loss are positioned on the higher-frequency side than the pass band, it is possible to reduce deterioration in insertion loss in the pass band. Furthermore, since the resonant frequency frs1 of the serial arm resonator 101 is positioned on the lower-frequency side than the anti-resonant frequencies Fap1 to Fap3 of the parallel arm resonance circuits, it is possible to narrow the pass band. That is, with the acoustic wave filter 10 according to Working Example 1, it is possible to achieve both the steepness of the pass band end portion and the low loss property of the pass band.

Furthermore, in the acoustic wave filter 10 according to Working Example 1, as shown in FIG. 4, the resonant frequency Frp3 of the parallel arm resonance circuit including the parallel arm resonator 203 and the bridging capacitance Cp3 is positioned on the lower-frequency side than the pass band. Furthermore, the resonant frequency Frp3 is closest to the low-frequency side end portion of the pass band among the resonant frequencies Frp1 to Frp3 of the three parallel arm resonance circuits.

With this configuration, since an attenuation pole on the low-frequency side is defined by the resonant frequency Frp3, by the parallel arm resonance circuit having a small resonance fractional band width, the steepness at the pass band low-frequency side end portion of the acoustic wave filter 10 can be improved.

Furthermore, in the acoustic wave filter 10 according to Working Example 1, as shown in FIG. 4, a resonant frequency Frs2 of the serial arm resonance circuit (second serial arm resonance circuit) in which the serial arm resonator 102 and the bridging capacitance Cs2 are connected in parallel, and a resonant frequency frs3 of the serial arm resonator 103 (second serial arm resonance circuit) are positioned on the higher-frequency side than the pass band. In the acoustic wave resonator, in the frequency band from the resonant frequency to the anti-resonant frequency, the impedance of the acoustic wave resonator has an inductive property. On the other hand, on the lower-frequency side than the resonant frequency and on the higher-frequency side than the anti-resonant frequency, the impedance of the acoustic wave resonator has a capacitive property. That is, the serial arm resonance circuit (second serial arm resonance circuit) in which the serial arm resonator 102 and the bridging capacitance Cs2 are connected in parallel, and the serial arm resonator 103 (second serial arm resonance circuit) both have the capacitive impedance in the pass band positioned on the lower-frequency side than the resonant frequency.

As in Working Example 1, when the anti-resonant frequency of the parallel arm resonance circuit is positioned on the higher-frequency side than the pass band, the inductive region between the resonant frequency and the anti-resonant frequency of the parallel arm resonance circuit is positioned within the pass band. Accordingly, in the acoustic wave filter 10 according to Working Example 1, focusing on the impedance of the parallel arm resonance circuit, the impedance in the pass band is shifted to be inductive as compared to the existing ladder acoustic wave filter in which the anti-resonant frequency of the parallel arm resonance circuit is positioned within the pass band. In contrast, according to the above-described configuration of the serial arm resonance circuit in Working Example 1, the impedance in the pass band of the second serial arm resonance circuit is capacitive. Accordingly, since the impedance in the pass band of the acoustic wave filter 10 can be positioned in a low reactance region, it is possible to achieve the low-loss acoustic wave filter 10 in which matching loss with an external circuit is reduced.

Note that in Working Example 1, among the four serial arm resonance circuits (serial arm resonators) of the acoustic wave filter 10, the resonant frequencies of two serial arm resonance circuits (serial arm resonators) are positioned on the higher-frequency side than the pass band. However, the number of serial arm resonance circuits the resonant frequencies of which are positioned on the higher-frequency side than the pass band is set in accordance with the inductive impedance of the parallel arm resonance circuit the anti-resonant frequency of which is positioned on the higher-frequency side than the pass band.

Furthermore, as a method for bringing the capacitive impedance of the serial arm resonance circuit to the pass band, the anti-resonant frequency of the serial arm resonance circuit may be disposed on the lower-frequency side than the pass band. However, since bulk wave radiation and a stopband ripple are present on the higher-frequency side than the anti-resonant frequency, the position of the anti-resonant frequency is set so as not to adversely affect the pass band.

Furthermore, in the acoustic wave filter 10 according to Working Example 1, as illustrated in FIG. 1, the bridging capacitance Cs4 is connected in parallel to the serial arm resonator 104. Here, as shown in FIG. 4, a resonant frequency Frs4 of the serial arm resonance circuit (third serial arm resonance circuit) in which the serial arm resonator 104 and the bridging capacitance Cs4 are connected in parallel is positioned on the lower-frequency side than the pass band, and an anti-resonant frequency Fas4 thereof is positioned on the higher-frequency side than the pass band.

With this configuration, since an attenuation pole on the high-frequency side is defined by the anti-resonant frequency of the third serial arm resonance circuit, the steepness of the pass band high-frequency side end portion of the acoustic wave filter 10 can be improved by the third serial arm resonance circuit having a small resonance fractional band width. Furthermore, by positioning the resonant frequency of the third serial arm resonance circuit on the lower-frequency side than the pass band, it is possible to narrow the pass band.

Note that in providing the third serial arm resonance circuit having a small resonance fractional band width, in Working Example 1, the configuration in which the bridging capacitance is connected to the serial arm resonator is provided, but as will be described in Preferred Embodiment 2 of the present invention described below, instead of connecting the bridging capacitance to the serial arm resonator, the IDT electrode of the serial arm resonator may include a first withdrawal electrode, a second withdrawal electrode, or a third withdrawal electrode, for example.

This configuration also can improve the steepness of the pass band high-frequency side end portion of the acoustic wave filter 10. Furthermore, by positioning the resonant frequency of the third serial arm resonance circuit on the lower-frequency side than the pass band, it is possible to narrow the pass band.

When the acoustic wave filters according to Working Example 1 and the comparative example are applied to the reception filter in Band 30 as shown in FIG. 7, the insertion loss in the pass band in Working Example 1 is about 2.02 dB, and the insertion loss in the pass band in the comparative example is about 2.42 dB. In addition, the attenuation of the SDARS band in Working Example 1 is about 7.8 dB, and the attenuation of the SDARS band in the comparative example is about 7.3 dB. That is, the acoustic wave filter 10 according to Working Example 1 is excellent in both of the low loss property of the insertion loss in the pass band and the high attenuation property of the low-frequency side attenuation band in the pass band, as compared with the acoustic wave filter according to the comparative example.

Note that the acoustic wave filter 10 according to Working Example 1 has the configuration in which the bridging capacitances are respectively added to all of the three parallel arm resonators 201 to 203 of the ladder filter, and all of the anti-resonant frequencies Fap1 to Fap3 of the three parallel arm resonance circuits to which the bridging capacitances are respectively added are positioned on the higher-frequency side than the pass band. However, in the acoustic wave filter 10 according to Preferred Embodiment 2, it is sufficient that the bridging capacitance is added to at least one of the three parallel arm resonators of the ladder filter, and the anti-resonant frequency of the at least one parallel arm resonance circuit (first parallel arm resonance circuit) to which the bridging capacitance is added is positioned on the higher-frequency side than the pass band. In addition, at this time, it is sufficient that the resonant frequency of the first serial arm resonance circuit of the one or more serial arm resonance circuits is positioned on the lower-frequency side than the anti-resonant frequency of the above-described at least one parallel arm resonance circuit (first parallel arm resonance circuit). That is, in the acoustic wave filter according to Preferred Embodiment 1, by causing the vicinity of the anti-resonant frequency of the parallel arm resonance circuit, in which the resonance fractional band width decreases but the return loss increases, to deviate from the pass band, insertion loss deterioration due to the bridging capacitance is reduced or prevented, and filter characteristics having low loss and high steepness are achieved.

According to this configuration, by positioning the anti-resonant frequency of the first parallel arm resonance circuit having a large return loss on the higher-frequency side than the pass band, while securing the steepness at the pass band low-frequency side end portion by reducing the resonance fractional band width, it is possible to reduce the insertion loss in the pass band. Furthermore, by positioning the resonant frequency of the serial arm resonance circuit on the lower-frequency side than the anti-resonant frequency of the first parallel arm resonance circuit, it is possible to narrow the pass band.

Note that as in the acoustic wave filter 10 according to Preferred Embodiment 1, by positioning the anti-resonant frequencies Fap1 to Fap3 of all of the parallel arm resonance circuits on the higher-frequency side than the pass band and by positioning the resonant frequency of the first serial arm resonance circuit on the lower-frequency side than the anti-resonant frequencies Fap1 to Fap3, it is possible to improve or optimize the steepness at the pass band low-frequency side end portion and the loss reduction in the pass band by reducing the resonance fractional band width of each of the parallel arm resonance circuits.

Preferred Embodiment 2

In Preferred Embodiment 1, although the configuration in which the bridging capacitance is added to the parallel arm resonator has been described as the configuration to reduce the resonance fractional band width of the parallel arm resonance circuit, in Preferred Embodiment 2 of the present invention, a configuration in which the IDT electrode of the parallel arm resonator includes a withdrawal electrode will be described as a configuration to reduce the resonance fractional band width of the parallel arm resonance circuit.

2.1 Circuit Configuration of Acoustic Wave Filter

Figure 8:
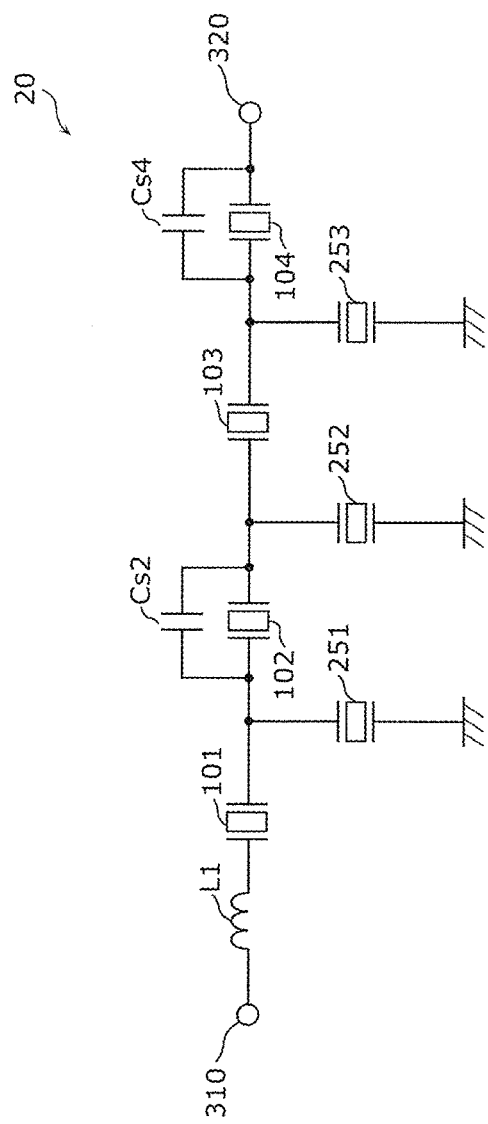
FIG. 8 is a circuit configuration diagram of an acoustic wave filter according to Preferred Embodiment 2 of the present invention.

FIG. 8 is a circuit configuration diagram of an acoustic wave filter 20 according to Preferred Embodiment 2. As illustrated in the diagram, the acoustic wave filter 20 includes serial arm resonators 101, 102, 103, and 104, parallel arm resonators 251, 252, and 253, bridging capacitances Cs2 and Cs4, inductor L1, and input/output terminals 310 and 320.

The acoustic wave filter 20 according to Preferred Embodiment 2 differs from the acoustic wave filter 10 according to Preferred Embodiment 1 in the configuration of the parallel arm resonator (parallel arm resonance circuit). Hereinafter, for the acoustic wave filter 20 according to Preferred Embodiment 2, description of the same or corresponding configurations as those of the acoustic wave filter 10 according to Preferred Embodiment 1 will be omitted, and descriptions will be provided focusing on different configurations.

The parallel arm resonators 251 to 253 are each disposed between a node on the path on which the serial arm resonators 101 to 104 are disposed and the ground terminal. By the above-described connection configuration of the serial arm resonators 101 to 104 and the parallel arm resonators 251 to 253, the acoustic wave filter 20 defines a ladder band pass filter.

The bridging capacitance Cs2 connected in parallel to the input/output ends of the serial arm resonator 102 is added to the serial arm resonator 102. Furthermore, the bridging capacitance Cs4 connected in parallel to the input/output ends of the serial arm resonator 104 is added to the serial arm resonator 104.

The parallel arm resonator 251 includes any of a first withdrawal electrode, a second withdrawal electrode, and a third withdrawal electrode. Furthermore, the parallel arm resonator 252 includes any of the first withdrawal electrode, the second withdrawal electrode, and the third withdrawal electrode. Furthermore, the parallel arm resonator 253 includes any of the first withdrawal electrode, the second withdrawal electrode, and the third withdrawal electrode. The configurations of the first withdrawal electrode, the second withdrawal electrode, and the third withdrawal electrode will be described with reference to FIGS. 9A to 9C, respectively.

The serial arm resonator 101, a circuit in which the serial arm resonator 102 and the bridging capacitance Cs2 are connected in parallel, the serial arm resonator 103, and a circuit in which the serial arm resonator 104 and the bridging capacitance Cs4 are connected in parallel respectively define serial arm resonance circuits disposed on the path connecting the input/output terminal 310 and the input/output terminal 320.

Furthermore, the parallel arm resonators 251, 252, and 253 respectively define parallel arm resonance circuits each disposed between the node on the path and the ground.

With the above-described configuration, the acoustic wave filter 20 defines and functions as a band pass filter having a pass band and an attenuation band on at least one of a lower-frequency side and a higher-frequency side than the pass band.

Note that the ground terminals to which the parallel arm resonators 251 to 253 are respectively connected may be shared on a substrate on which the parallel arm resonators 251 to 253 are formed or may be individually provided on the substrate, and are set from the viewpoint of adjusting an attenuation pole of the acoustic wave filter 20.

Additionally, the bridging capacitances Cs2 and Cs4 may not be provided.

Furthermore, it is sufficient that at least one of the parallel arm resonators 251, 252, and 253 includes any of the first withdrawal electrode, the second withdrawal electrode, and the third withdrawal electrode.

Furthermore, the number of serial arm resonators of the acoustic wave filter 20 is not limited to four as illustrated in FIG. 8, and it is sufficient that the number is equal to or greater than one. Furthermore, the number of parallel arm resonators of the acoustic wave filter 20 is not limited to three as illustrated in FIG. 8, and it is sufficient that the number is equal to or greater than one. Additionally, the inductor L1 may not be provided.

Furthermore, a circuit element such as an inductor, a capacitor, or the like, or a longitudinally coupled-type resonator, and the like, for example, may be inserted between the serial arm resonators 101 to 104, the parallel arm resonators 251 to 253, and the input/output terminals 310 and 320.

Hereinafter, the structures of the first withdrawal electrode, the second withdrawal electrode, and the third withdrawal electrode included in the parallel arm resonators 251 to 253 will be described.

2.2 Electrode Structure of Parallel Arm Resonator

Figure 9A:
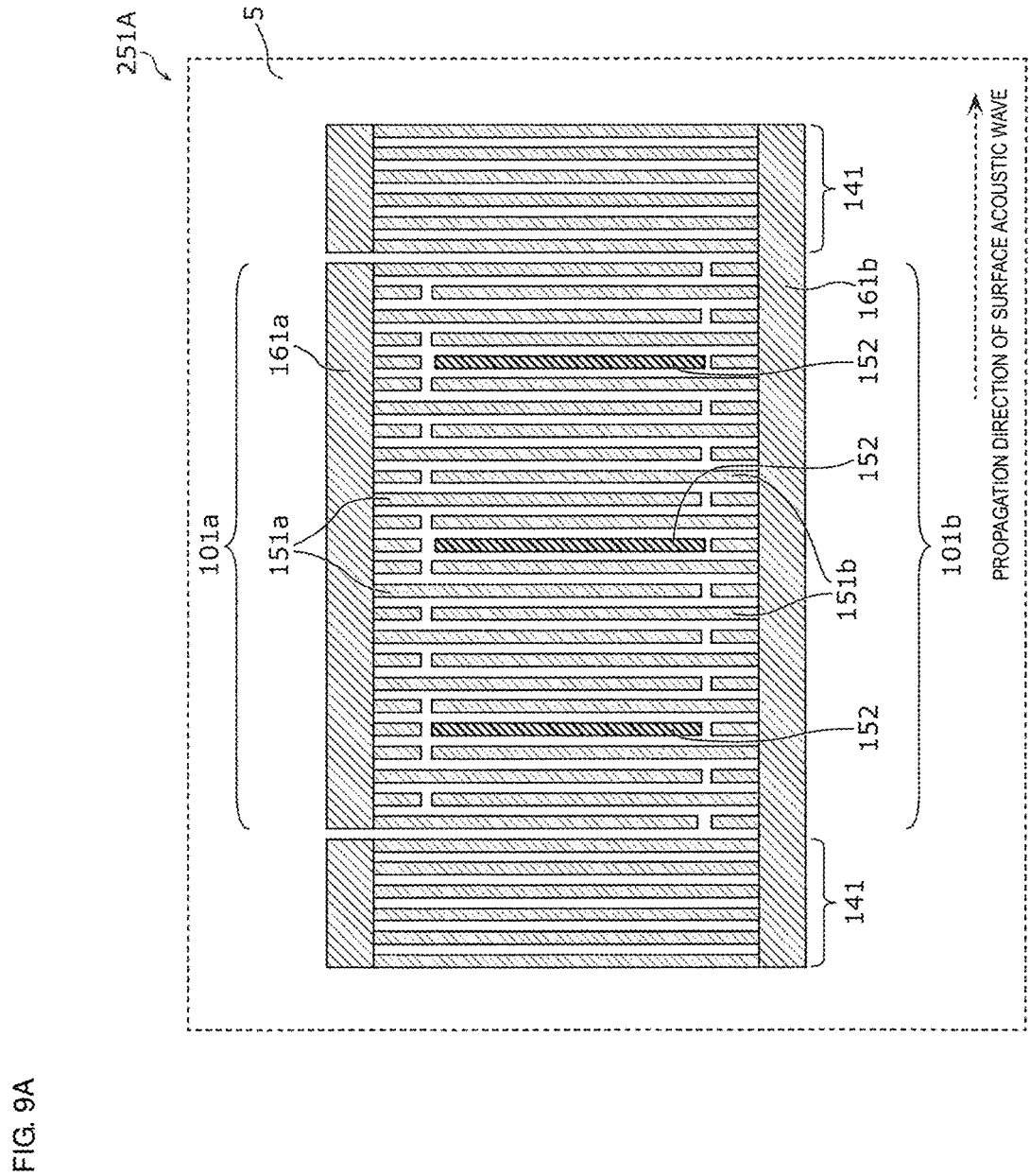
FIG. 9A is a rough plan view illustrating a first example of the configuration of an IDT electrode of a parallel arm resonator of the acoustic wave filter according to Preferred Embodiment 2 of the present invention.
Figure 9C:
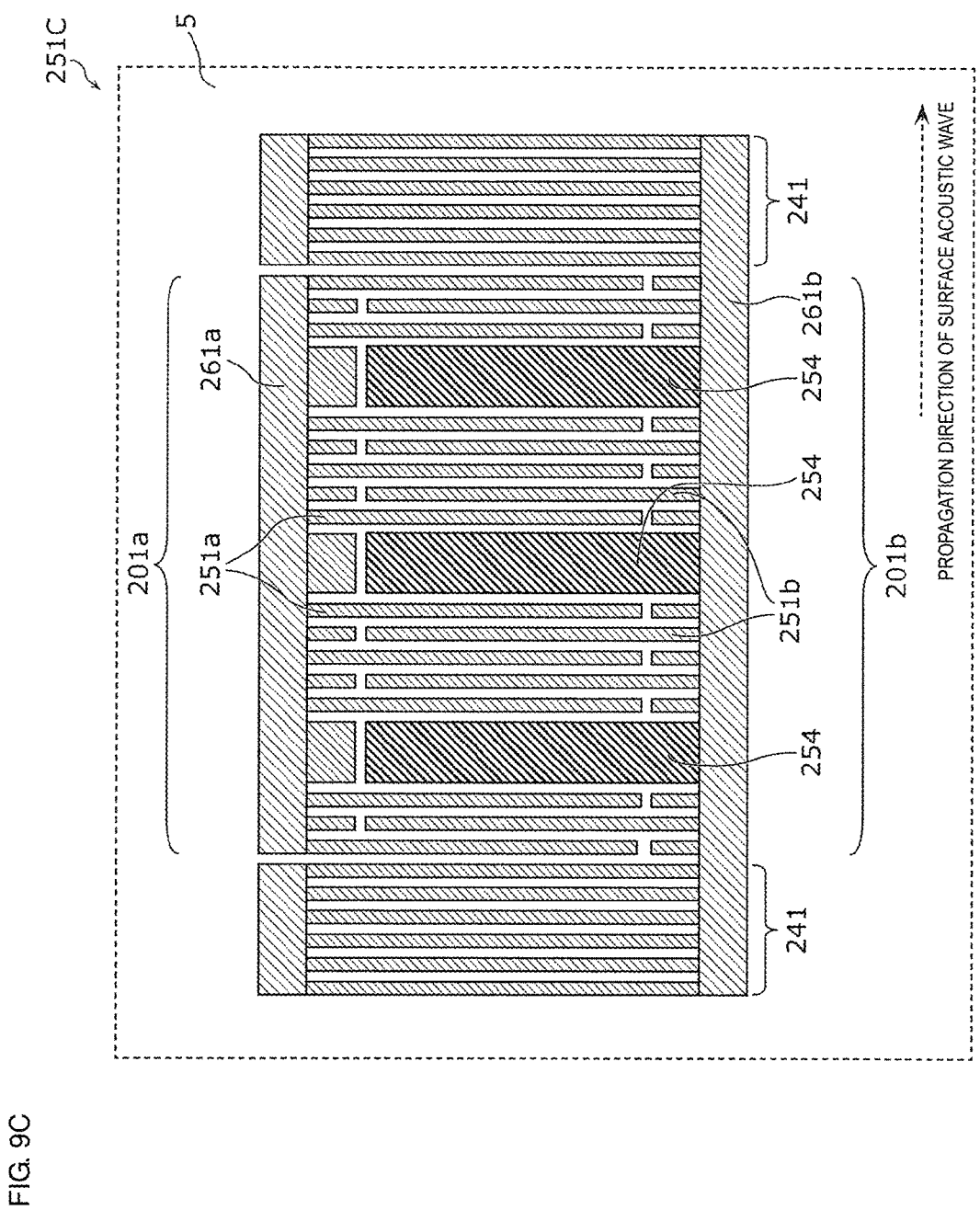
FIG. 9C is a rough plan view illustrating a third example of the configuration of the IDT electrode of the parallel arm resonator of the acoustic wave filter according to Preferred Embodiment 2 of the present invention.

FIG. 9A is a rough plan view illustrating a first example of the configuration of the IDT electrode of the parallel arm resonators 251 to 253 of the acoustic wave filter 20 according to Preferred Embodiment 2. FIG. 9B is a rough plan view illustrating a second example of the configuration of the IDT electrode of the parallel arm resonators 251 to 253 of the acoustic wave filter 20 according to Preferred Embodiment 2. FIG. 9C is a rough plan view illustrating a third example of the configuration of the IDT electrode of the parallel arm resonators 251 to 253 of the acoustic wave filter 20 according to Preferred Embodiment 2.

A parallel arm resonator 251A illustrated in FIG. 9A is the first example of the electrode configuration of the parallel arm resonators 251 to 253, and a schematic plan view showing the IDT electrode structure of the parallel arm resonators 251 to 253 is illustrated as an example. Note that the parallel arm resonator 251A illustrated in FIG. 9A is illustrated to describe a typical structure of the parallel arm resonators 251 to 253, and the number, the lengths, and the like, for example, of electrode fingers of the electrode are not limited thereto.

The parallel arm resonator 251A includes the substrate 5 having piezoelectricity, comb-shaped electrodes 101a and 101b formed on the substrate 5, and reflectors 141.

As illustrated in FIG. 9A, the comb-shaped electrode 101a includes a plurality of electrode fingers 151a that are parallel or substantially parallel to one another, and a busbar electrode 161a that connects one ends of the plurality of electrode fingers 151a to one another. Furthermore, the comb-shaped electrode 101b includes a plurality of electrode fingers 151b that is parallel or substantially parallel to one another, and a busbar electrode 161b that connects one ends of the plurality of electrode fingers 151b to one another. The plurality of electrode fingers 151a and 151b extend along a direction orthogonal or substantially orthogonal to a propagation direction of the surface acoustic wave (X-axis direction). The comb-shaped electrodes 101a and 101b face each other such that the plurality of electrode fingers 151a and the plurality of electrode fingers 151b interdigitate with each other. That is, the IDT electrode of the parallel arm resonator 251A includes a pair of the comb-shaped electrodes 101a and 101b.

Note that although the comb-shaped electrode 101a includes dummy electrodes that face the plurality of electrode fingers 151b in the lengthwise direction, the dummy electrodes may not be provided. Furthermore, although the comb-shaped electrode 101b includes dummy electrodes that face the plurality of electrode fingers 151a in the lengthwise direction, the dummy electrodes may not be provided.

The reflectors 141 each include a plurality of electrode fingers that are parallel or substantially parallel to one another and busbar electrodes that connect the plurality of electrode fingers, and are respectively disposed on both ends of the pair of comb-shaped electrodes 101a and 101b.

Note that the IDT electrode including the pair of comb-shaped electrodes 101a and 101b has a laminated structure including the close contact layer 541 and the main electrode layer 542 as illustrated in part (b) of FIG. 2A, but is not limited to the laminated structure.

Here, in the IDT electrode of the parallel arm resonator 251A, electrode fingers 152 are discretely provided. The electrode fingers 152 are the first withdrawal electrodes (floating electrodes) that are connected to neither of the busbar electrodes 161a and 161b, and are parallel or substantially parallel to and have at the same or substantially the same pitch as the plurality of electrode fingers 151a and 151b. Furthermore, a plurality of electrode fingers 151a and 151b are disposed between two adjacent electrode fingers 152. That is, the pitch of the electrode fingers 152 is larger than the pitch of the plurality of electrode fingers 151a and 151b.

A parallel arm resonator 251B illustrated in FIG. 9B is the second example of the electrode configuration of the parallel arm resonators 251 to 253, and a schematic plan view showing the IDT electrode structure of the parallel arm resonators 251 to 253 is illustrated as an example. Note that the parallel arm resonator 251B illustrated in FIG. 9B is illustrated to describe a typical structure of the parallel arm resonators 251 to 253, and the number, the lengths, and the like of electrode fingers of the electrode are not limited thereto.

The parallel arm resonator 251B includes the substrate 5 having piezoelectricity, comb-shaped electrodes 301a and 301b formed on the substrate 5, and reflectors 341.

As illustrated in FIG. 9B, the comb-shaped electrode 301a includes a plurality of electrode fingers 351a that are parallel or substantially parallel to one another, and a busbar electrode 361a that connects one ends of the plurality of electrode fingers 351a to one another. Furthermore, the comb-shaped electrode 301b includes a plurality of electrode fingers 351b that are parallel or substantially parallel to one another, and a busbar electrode 361b that connects one ends of the plurality of electrode fingers 351b to one another. The plurality of electrode fingers 351a and 351b extend along a direction orthogonal or substantially orthogonal to an acoustic wave propagation direction (X-axis direction). The comb-shaped electrodes 301a and 301b face each other such that the plurality of electrode fingers 351a and the plurality of electrode fingers 351b interdigitate with each other. That is, the IDT electrode of the parallel arm resonator 251B includes a pair of the comb-shaped electrodes 301a and 301b.

Note that although the comb-shaped electrode 301a includes dummy electrodes that face the plurality of electrode fingers 351b in the lengthwise direction, the dummy electrodes may not be provided. Furthermore, although the comb-shaped electrode 301b includes dummy electrodes that face the plurality of electrode fingers 351a in the lengthwise direction, the dummy electrodes may not be provided.

The reflectors 341 each include a plurality of electrode fingers that are parallel or substantially parallel to one another and busbar electrodes that connect the plurality of electrode fingers, and are respectively disposed on both ends of the pair of comb-shaped electrodes 301a and 301b.

Note that the IDT electrode including the pair of comb-shaped electrodes 301a and 301b has a laminated structure including close contact layer 541 and the main electrode layer 542 as illustrated in part (b) of FIG. 2A, but is not limited to the laminated structure.

Here, in the IDT electrode of the parallel arm resonator 251B, electrode fingers 352 are discretely provided. The electrode fingers 352 are the third withdrawal electrodes (inverted withdrawal electrodes) connected to the same busbar electrode as the busbar electrode to which the electrode fingers on both adjacent sides are connected among all of the electrode fingers of the pair of comb-shaped electrodes 301a and 301b. Furthermore, a plurality of electrode fingers 351a and 351b are disposed between two adjacent electrode fingers 352. That is, the pitch of the electrode fingers 352 is larger than the pitch of the plurality of electrode fingers 351a and 351b.

A parallel arm resonator 251C illustrated in FIG. 9C is the third example of the electrode configuration of the parallel arm resonators 251 to 253, and a schematic plan view showing the IDT electrode structure of the parallel arm resonators 251 to 253 is illustrated as an example. Note that the parallel arm resonator 251C illustrated in FIG. 9C is illustrated to describe a typical structure of the parallel arm resonators 251 to 253, and the number, the lengths, and the like of electrode fingers of the electrode are not limited thereto.

The parallel arm resonator 251C includes the substrate 5 having piezoelectricity, comb-shaped electrodes 201a and 201b formed on the substrate 5, and reflectors 241.

As illustrated in FIG. 9C, the comb-shaped electrode 201a includes a plurality of electrode fingers 251a that are parallel or substantially parallel to one another, and a busbar electrode 261a that connects one ends of the plurality of electrode fingers 251a to one another. Furthermore, the comb-shaped electrode 201b includes a plurality of electrode fingers 251b that are parallel or substantially parallel to one another, and a busbar electrode 261b that connects one ends of the plurality of electrode fingers 251b to one another. The plurality of electrode fingers 251a and 251b extend along a direction orthogonal or substantially orthogonal to a propagation direction of the surface acoustic wave (X-axis direction). The comb-shaped electrodes 201a and 201b face each other such that the plurality of electrode fingers 251a and the plurality of electrode fingers 251b interdigitate with each other. That is, the IDT electrode of the parallel arm resonator 251C includes a pair of the comb-shaped electrodes 201a and 201b.

Note that although the comb-shaped electrode 201a includes dummy electrodes that face the plurality of electrode fingers 251b in the lengthwise direction, the dummy electrodes may not be provided. Furthermore, although the comb-shaped electrode 201b includes dummy electrodes that face the plurality of electrode fingers 251a in the lengthwise direction, the dummy electrodes may not be provided.

The reflectors 241 each include a plurality of electrode fingers that are parallel or substantially parallel to one another and busbar electrodes that connect the plurality of electrode fingers, and are respectively disposed on both ends of the pair of comb-shaped electrodes 201a and 201b.

Note that the IDT electrode including the pair of comb-shaped electrodes 201a and 201b has a laminated structure including the close contact layer 541 and the main electrode layer 542 as illustrated in FIG. 2A(b), but is not limited to the laminated structure.

Here, in the IDT electrode of the parallel arm resonator 251C, electrode fingers 254 are discretely provided. The electrode fingers 254 are electrode fingers each having the maximum electrode finger width in the IDT electrode of the parallel arm resonator 251C, and are the second withdrawal electrodes (filled electrodes) each having an electrode finger width of two or more times an average electrode finger width of the electrode fingers excluding the electrode fingers 254. In other words, the electrode fingers 254 are each provided as one electrode finger obtained by combining adjacent electrode fingers 251a and 251b and a space between the adjacent electrode fingers 251a and 251b, are each connected to either of the busbar electrodes 261a and 261b, and are the second withdrawal electrodes (filled electrodes) each having a wider electrode finger width than that of the plurality of electrode fingers 251a and 251b. Furthermore, a plurality of electrode fingers 251a and 251b are disposed between two adjacent electrode fingers 254. That is, the pitch of the electrode fingers 254 is larger than the pitch of the plurality of electrode fingers 251a and 251b.

In the acoustic wave filter 20 according to Preferred Embodiment 2, at least one of the parallel arm resonators 251, 252, and 253 includes any of the first withdrawal electrode, the second withdrawal electrode, and the third withdrawal electrode. In other words, at least one of the parallel arm resonators 251, 252, and 253 is any of the parallel arm resonators 251A, 251B, and 251C.

Note that the expression that "at least one of the parallel arm resonators 251, 252, and 253 includes the first withdrawal electrode" means that it is sufficient that at least one of the parallel arm resonators 251, 252, and 253 includes at least one electrode finger 152 (first withdrawal electrode (floating electrode)) illustrated in FIG. 9A. Furthermore, the expression that "at least one of the parallel arm resonators 251, 252, and 253 includes the third withdrawal electrode" means that it is sufficient that at least one of the parallel arm resonators 251, 252, and 253 includes at least one electrode finger 352 (third withdrawal electrode (inverted withdrawal electrode)) illustrated in FIG. 9B. Furthermore, the expression that "at least one of the parallel arm resonators 251, 252, and 253 includes the second withdrawal electrode" means that it is sufficient that at least one of the parallel arm resonators 251, 252, and 253 includes at least one electrode finger 254 (second withdrawal electrode (filled electrode)) illustrated in FIG. 9C.

2.3 Bandpass Characteristics of Acoustic Wave Filter

Figure 10A:
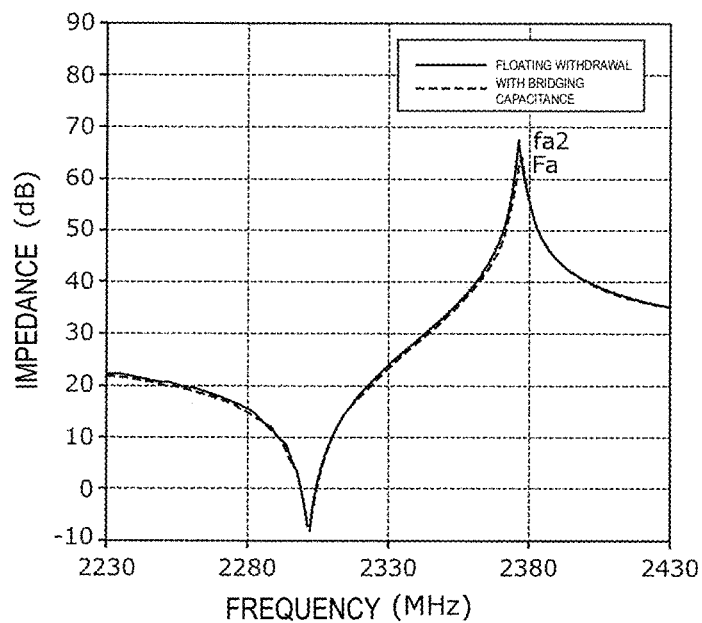
FIG. 10A is a graph comparing impedance characteristics of resonance circuits with a floating withdrawal electrode and with a bridging capacitance element.

FIG. 10A is a graph comparing impedance characteristics of resonance circuits with the first withdrawal electrode (floating withdrawal electrode) and with the bridging capacitance. The graph shows impedance (broken line in FIG. 10A) of the acoustic wave resonance circuit to which the bridging capacitance is added, which is the structure of the parallel arm resonance circuit of Preferred Embodiment 1, and impedance (solid line in FIG. 10A) of the acoustic wave resonator whose IDT electrode includes the first withdrawal electrode (floating withdrawal electrode), which is the structure of the parallel arm resonator of Preferred Embodiment 2.

Both the anti-resonant frequency Fa of the acoustic wave resonance circuit to which the bridging capacitance is added and an anti-resonant frequency fa2 of the acoustic wave resonator whose IDT electrode includes the first withdrawal electrode (floating withdrawal electrode) are shifted to the low-frequency side relative to the anti-resonant frequency fa (not illustrated in FIG. 10A) of the acoustic wave resonator alone to which the bridging capacitance is not added and which does not include the first withdrawal electrode (floating withdrawal electrode), and therefore, the resonance fractional band width can be reduced. However, the impedances of the anti-resonant frequencies Fa and fa2 are smaller than the impedance of the anti-resonant frequency fa.

Figure 10B:
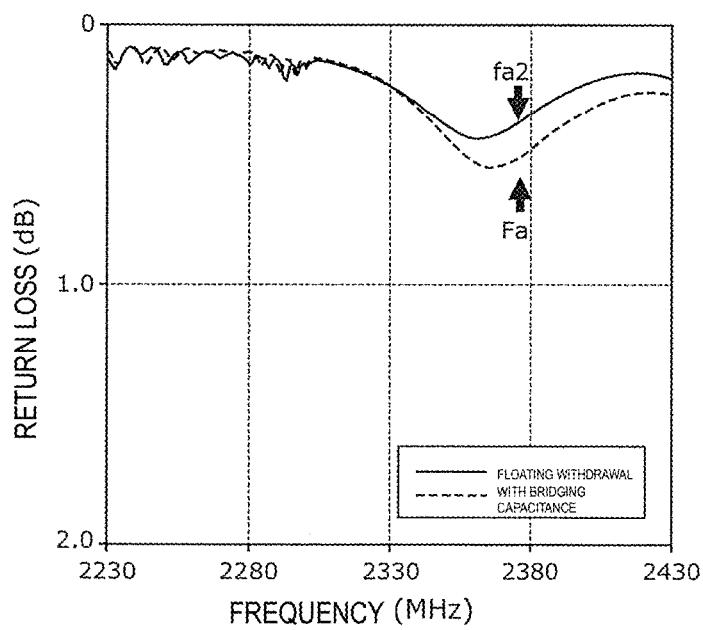
FIG. 10B is a graph comparing reflection characteristics of resonance circuits with the floating withdrawal electrode and with the bridging capacitance element.

FIG. 10B is a graph comparing reflection characteristics of resonance circuits with the first withdrawal electrode (floating withdrawal electrode) and with the bridging capacitance.

In response to the change in the impedance characteristics shown in FIG. 10A, the return loss in the vicinity of the anti-resonant frequency Fa of the acoustic wave resonance circuit to which the bridging capacitance is added and the anti-resonant frequency fa2 of the acoustic wave resonator whose IDT electrode includes the first withdrawal electrode (floating withdrawal electrode) are larger than the return loss (not shown in FIG. 10B) in the vicinity of the anti-resonant frequency fa of the acoustic wave resonator alone.

In contrast, in the acoustic wave filter 20 according to Preferred Embodiment 2, the anti-resonant frequency Fap1 of the parallel arm resonance circuit (first parallel arm resonance circuit) including the parallel arm resonator 251, the anti-resonant frequency Fap2 of the parallel arm resonance circuit (first parallel arm resonance circuit) including the parallel arm resonator 252, and the anti-resonant frequency Fap3 of the parallel arm resonance circuit (first parallel arm resonance circuit) including the parallel arm resonator 253 are all positioned on the higher-frequency side than the pass band. In addition, the resonant frequency frs1 of the serial arm resonance circuit (first serial arm resonance circuit) including the serial arm resonator 101 is positioned on the lower-frequency side than the anti-resonant frequencies Fap1, Fap2, and Fap3 of the above-described parallel arm resonance circuits.

Figure 11:
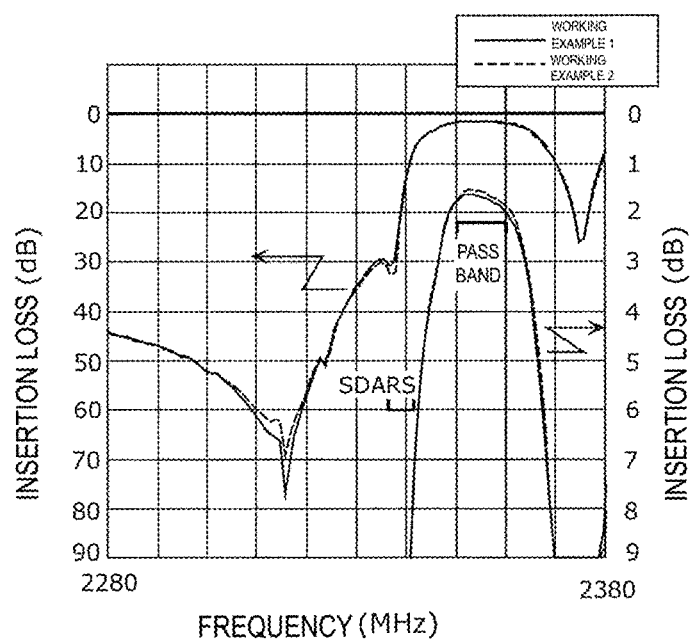
FIG. 11 is a graph comparing bandpass characteristics of the acoustic wave filters according to Working Example 1 and Working Example 2.

FIG. 11 is a graph comparing bandpass characteristics of the acoustic wave filters according to Working Example 1 and Working Example 2.

Here, the acoustic wave filter 20 according to Working Example 2 includes the circuit configuration of the acoustic wave filter 20 according to Preferred Embodiment 2 illustrated in FIG. 8, and the parallel arm resonators 251, 252, and 253 each include the first withdrawal electrode. Furthermore, resonant frequencies and anti-resonant frequencies of the respective acoustic wave resonators of the acoustic wave filter 20 and specific values of the bridging capacitances Cs2 and Cs4 added to the serial arm resonators 102 and 104 are the same or substantially the same as those of the acoustic wave filter 10 according to Working Example 1. The acoustic wave filters according to Working Example 1 and Working Example 2 are applied as, for example, a reception filter for Band 30 (reception band: about 2350 MHz to about 2360 MHz) of LTE. Band 30 has a reception band whose band width is about 10 MHz, has an attenuation band of the SDARS band (about 2336.2 MHz to about 2341.3 MHz) on the lower-frequency side than the pass band, and is required to have a narrow band and a high steepness at the low-frequency side end portion.

As shown in FIG. 11, with the acoustic wave filter 20 according to Working Example 2, the parallel arm resonators 251, 252, and 253 each include the first withdrawal electrode, such that a parallel arm resonance circuit having a small resonance fractional band width is provided. This makes it possible to improve the steepness at the pass band low-frequency side end portion of the ladder acoustic wave filter 20. Furthermore, since the anti-resonant frequencies Fap1 to Fap3 of the parallel arm resonance circuits each including the first withdrawal electrode and each having a large return loss are positioned on the higher-frequency side than the pass band, it is possible to reduce deterioration in insertion loss in the pass band. Furthermore, since the resonant frequency frs1 of the serial arm resonator 101 is positioned on the lower-frequency side than the anti-resonant frequencies Fap1 to Fap3 of the parallel arm resonance circuits, it is possible to narrow the pass band. That is, with the acoustic wave filter 20 according to Working Example 2, it is possible to achieve both the steepness of the pass band end portion and the low loss property of the pass band.

When the acoustic wave filter 20 according to Working Example 2 is applied to the reception filter in Band 30, the insertion loss in the pass band is about 1.91 dB, and the insertion loss in the pass band in Working Example 1 is about 2.02 dB. That is, the acoustic wave filter 20 according to Working Example 2 can reduce insertion loss in the pass band to a greater extent than the acoustic wave filter 10 according to Working Example 1.

This is caused by, as illustrated in FIG. 10A, the impedance in the vicinity of the anti-resonant frequency fa2 of the acoustic wave resonator whose IDT electrode including the first withdrawal electrode being larger than the impedance in the vicinity of the anti-resonant frequency Fa of the acoustic wave resonance circuit to which the bridging capacitance is added. Accordingly, as shown in FIG. 10B, the return loss in the vicinity of the anti-resonant frequency fa2 is smaller than the return loss in the vicinity of the anti-resonant frequency Fa. As a result, in the ladder filter in which the pass band is provided in the region from the resonant frequency to the anti-resonant frequency of the parallel arm resonance circuit, the acoustic wave filter 20 of Working Example 2 having the small return loss in the vicinity of the anti-resonant frequency fa2 can further reduce the insertion loss.

Note that the acoustic wave filter 20 according to Working Example 2 may have a configuration in which the IDT electrode of each of the parallel arm resonators 251 to 253 includes the second withdrawal electrode or the third withdrawal electrode, instead of the configuration in which the IDT electrode of each of the parallel arm resonators 251 to 253 includes the first withdrawal electrode. Even in this case, it is possible to achieve the same or substantially the same advantageous effects as those of the acoustic wave filter 20 according to Working Example 2. Furthermore, even in a configuration in which the IDT electrode of each of the parallel arm resonators 251 to 253 includes a withdrawal electrode other than the first withdrawal electrode, the second withdrawal electrode, and the third withdrawal electrode, it is possible to achieve both the steepness of the pass band end portion and the low loss property of the pass band. Note, however, that the first withdrawal electrode (floating withdrawal electrode) of the withdrawal electrodes can improve or optimize the steepness and the low loss property of the acoustic wave filter.

Note that the acoustic wave filter 20 according to Preferred Embodiment 2 has the configuration in which all of the three parallel arm resonators 251 to 253 of the ladder filter each include any of the first withdrawal electrode, the second withdrawal electrode, and the third withdrawal electrode, and all of the anti-resonant frequencies Fap1 to Fap3 of the three parallel arm resonance circuits are positioned on the higher-frequency side than the pass band. However, in the acoustic wave filter 20 according to Preferred Embodiment 2, it is sufficient that at least one of the three parallel arm resonators of the ladder filter includes any of the first withdrawal electrode, the second withdrawal electrode, and the third withdrawal electrode, and the anti-resonant frequency of the at least one parallel arm resonance circuit (first parallel arm resonance circuit) which includes any of the first withdrawal electrode, the second withdrawal electrode, and the third withdrawal electrode is positioned on the higher-frequency side than the pass band. In addition, at this time, it is sufficient that the resonant frequency of the first serial arm resonance circuit of the one or more serial arm resonance circuits is positioned on the lower-frequency side than the anti-resonant frequency of the above-described at least one parallel arm resonance circuit (first parallel arm resonance circuit). That is, in the acoustic wave filter according to Preferred Embodiment 2, by causing the vicinity of the anti-resonant frequency of the parallel arm resonance circuit, in which the resonance fractional band width decreases but the return loss increases, to deviate from the pass band, insertion loss deterioration due to the withdrawal electrode is reduced or prevented, and filter characteristics having low loss and high steepness are achieved.

Note that as in the acoustic wave filter 20 according to Preferred Embodiment 2, by positioning the anti-resonant frequencies Fap1 to Fap3 of all of the parallel arm resonance circuits on the higher-frequency side than the pass band and by positioning the resonant frequency of the first serial arm resonance circuit on the lower-frequency side than the anti-resonant frequencies Fap1 to Fap3, it is possible to improve or optimize the steepness at both the ends of the pass band and the loss reduction in the pass band by reducing the resonance fractional band width of each of the parallel arm resonance circuits.

Although the acoustic wave filters 10 and 20 according to the above-described preferred embodiments have been described, the acoustic wave filters according to the present invention are not limited to the above-described preferred embodiments. The present invention also encompasses other preferred embodiments that are provided by combining desired elements in the above-described preferred embodiments, modifications obtained by adding various changes to the above-described preferred embodiments, which are conceived by those skilled in the art, without departing from the gist of the present invention, and various apparatuses including the acoustic wave filters 10 and 20 according to the above-described preferred embodiments.

The acoustic wave resonator of the acoustic wave filters 10 and 20 according to the above-described preferred embodiments may be, for example, the surface acoustic wave (SAW: Surface Acoustic Wave) resonator described above, or may be a BAW (Bulk Acoustic Wave) device, an FBAR (Film Bulk Acoustic Resonator), or the like.

Note that the SAW includes not only a surface acoustic wave but also a boundary wave.

Preferred embodiments of the present invention can be widely used for communication apparatuses, such as a mobile phone and the like, for example, as an acoustic wave filter having high steepness that can be applied to a multi-band and multi-mode frequency standard.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass acoustic wave filter having a pass band and an attenuation band on at least one of a lower-frequency side and a higher-frequency side than the pass band, the acoustic wave filter comprising:
    a first input/output terminal and a second input/output terminal;
    at least one serial arm resonance circuit on a path connecting the first input/output terminal and the second input/output terminal; and
    at least one parallel arm resonance circuit between a node on the path and a ground; wherein
    each of the at least one serial arm resonance circuit and the at least one parallel arm resonance circuit includes at least one acoustic wave resonator;
    a first parallel arm resonance circuit of the at least one parallel arm resonance circuit includes a bridging capacitor connected in parallel to the at least one acoustic wave resonator;
    an anti-resonant frequency of the first parallel arm resonance circuit is on the higher-frequency side than the pass band; and
    a resonant frequency of a first serial arm resonance circuit of the at least one serial arm resonance circuit is on a lower-frequency side than the anti-resonant frequency of the first parallel arm resonance circuit.

2. The band pass acoustic wave filter according to claim 1, wherein
    any parallel arm resonance circuit of the at least one parallel arm resonance circuit includes
        a respective bridging capacitor connected in parallel to a respective acoustic wave resonator of the at least one acoustic wave resonator;
    an anti-resonant frequency of any parallel arm resonance circuit of the at least one parallel arm resonance circuit is on the higher-frequency side than the pass band; and
    the resonant frequency of the first serial arm resonance circuit is on a lower-frequency side than the anti-resonant frequency of any parallel arm resonance circuit of the at least one parallel arm resonance circuit.

3. A band pass acoustic wave filter having a pass band and an attenuation band on at least one of a lower-frequency side and a higher-frequency side than the pass band, the acoustic wave filter comprising:
    a first input/output terminal and a second input/output terminal;
    at least one serial arm resonance circuit on a path connecting the first input/output terminal and the second input/output terminal; and
    at least one parallel arm resonance circuit between a respective node on the path and a ground; wherein
    any serial arm resonance circuit of the at least one serial arm resonance circuit includes a serial arm resonator on the path;
    any parallel arm resonance circuit of the at least one parallel arm resonance circuit includes a parallel arm resonator between the respective node and the ground;
    each of the at least one serial arm resonator and the at least one parallel arm resonator includes at least one acoustic wave resonator including an IDT (InterDigital Transducer) electrode provided on a substrate having piezoelectricity;
    the IDT electrode includes a pair of comb-shaped electrodes each including a plurality of electrode fingers extending in a direction intersecting with an acoustic wave propagation direction and in parallel or substantially in parallel to one another, and bulbar electrodes connecting ends of electrode fingers of the plurality of electrode fingers to each other;
    where, among the plurality of electrode fingers:
        a first electrode finger which is not connected to the busbar electrodes is defined as a first withdrawal electrode,
        a second electrode finger having a maximum electrode finger width, and including an electrode finger width two or more times an average electrode finger width of the plurality of electrode fingers excluding the second electrode finger is defined as a second withdrawal electrode, and
        a third electrode finger connected to a same one of the busbar electrodes as adjacent electrode fingers on both adjacent sides of the third electrode finger in the acoustic wave propagation direction is defined as a third withdrawal electrode;
    a parallel arm resonator included in a first parallel arm resonance circuit of the at least one parallel arm resonance circuit includes at least one of the first withdrawal electrode, the second withdrawal electrode, and the third withdrawal electrode;

an anti-resonant frequency of the first parallel arm resonance circuit is on the higher-frequency side than the pass band; and a resonant frequency of a first serial arm resonance circuit of the at least one serial arm resonance circuit is on a lower-frequency side than the anti-resonant frequency of the first parallel arm resonance circuit.

4. The band pass acoustic wave filter according to claim 3, wherein the parallel arm resonator included in the first parallel arm resonance circuit of the at least one parallel arm resonance circuit includes the first withdrawal electrode.

5. The band pass acoustic wave filter according to claim 3, wherein
- a parallel arm resonator included in any parallel arm resonance circuit of the at least one parallel arm resonance circuit includes the first withdrawal electrode or the second withdrawal electrode;
- an anti-resonant frequency of any parallel arm resonance circuit is on the higher-frequency side than the pass band; and
- the resonant frequency of the first serial arm resonance circuit is on a lower-frequency side than an anti-resonant frequency of any parallel arm resonance circuit.

6. The band pass acoustic wave filter according to claim 1, wherein a resonant frequency of the first parallel arm resonance circuit is on the lower-frequency side than the pass band, and the resonant frequency of the first parallel arm resonance circuit of a resonant frequency of the at least one parallel arm resonance circuit is closest to a low frequency end portion of the pass band.

7. The band pass acoustic wave filter according to claim 1, wherein
- a resonant frequency of a second serial arm resonance circuit of the at least one serial arm resonance circuit is on the higher-frequency side than the pass band; and
- an impedance of the second serial arm resonance circuit in the pass band is capacitive.

8. The band pass acoustic wave filter according to claim 1, wherein
- a third serial arm resonance circuit of the at least one serial arm resonance circuit includes:
  - an acoustic wave resonator of the at least one acoustic wave resonator; and
  - a bridging capacitor connected in parallel to the acoustic wave resonator;
- a resonant frequency of the third serial arm resonance circuit is on the lower-frequency side than the pass band; and
- an anti-resonant frequency of the third serial arm resonance circuit is on the higher-frequency side than the pass band.

9. The band pass acoustic wave filter according to claim 8, wherein
- the acoustic wave resonator of the third serial arm resonance circuit includes an IDT electrode provided on a substrate having piezoelectricity;
- the IDT electrode includes a pair of comb-shaped electrodes each including a plurality of electrode fingers extending in a direction intersecting with an acoustic wave propagation direction and in parallel or substantially in parallel to one another, and busbar electrodes connecting ends of electrode fingers of the plurality of electrode fingers to each other;
- where, among the plurality of electrode fingers:
  - a first electrode finger which is not connected to the busbar electrodes is defined as a first withdrawal electrode,
  - a second electrode finger having a maximum electrode finger width, and having an electrode finger width two or more times an average electrode finger width of the plurality of electrode fingers excluding the second electrode finger is defined as a second withdrawal electrode, and
  - a third electrode finger connected to a same one of the busbar electrodes as adjacent electrode fingers on both adjacent sides in the acoustic wave propagation direction is defined as a third withdrawal electrode;
- the third serial arm resonance circuit includes any of the first withdrawal electrode, the second withdrawal electrode, and the third withdrawal electrode;
- a resonant frequency of the third serial arm resonance circuit is on the lower-frequency side than the pass band; and
- an anti-resonant frequency of the third serial arm resonance circuit is on the higher-frequency side than the pass band.

10. The band pass acoustic wave filter according to claim 3, wherein
- a resonant frequency of the first parallel arm resonance circuit is on the lower-frequency side than the pass band; and
- the resonant frequency of the first parallel arm resonance circuit of a resonant frequency of the at least one parallel arm resonance circuit is closest to a low frequency end portion of the pass band.

11. The band pass acoustic wave filter according to claim 3, wherein
- a resonant frequency of a second serial arm resonance circuit of the at least one serial arm resonance circuit is on the higher-frequency side than the pass band; and
- an impedance of the second serial arm resonance circuit in the pass band is capacitive.

12. The band pass acoustic wave filter according to claim 3, wherein
- a third serial arm resonance circuit of the at least one serial arm resonance circuit includes:
  - an acoustic wave resonator of the at least one acoustic wave resonator; and
  - a bridging capacitor connected in parallel to the acoustic wave resonator;
- a resonant frequency of the third serial arm resonance circuit is on the lower-frequency side than the pass band; and
- an anti-resonant frequency of the third serial arm resonance circuit is on the higher-frequency side than the pass band.

13. The band pass acoustic wave filter according to claim 12, wherein
- the acoustic wave resonator of the third serial arm resonance circuit includes an IDT electrode provided on a substrate having piezoelectricity;
- the IDT electrode includes a pair of comb-shaped electrodes each including a plurality of electrode fingers extending in a direction intersecting with an acoustic wave propagation direction and in parallel or substantially in parallel to one another, and busbar electrodes connecting ends of electrode fingers of the plurality of electrode fingers to each other;
- where, among the plurality of electrode fingers:

a first electrode finger which is connected to neither of the busbar electrodes of the pair of comb-shaped electrodes is defined as a first withdrawal electrode, a second electrode finger having a maximum electrode finger width, and having an electrode finger width two or more times an average electrode finger width of the plurality of electrode fingers excluding the second electrode finger is defined as a second withdrawal electrode, and a third electrode finger connected to a same one of the busbar electrodes as adjacent electrode fingers on both adjacent sides in the acoustic wave propagation direction is defined as a third withdrawal electrode;

the third serial arm resonance circuit includes any of the first withdrawal electrode, the second withdrawal electrode, and the third withdrawal electrode;

a resonant frequency of the third serial arm resonance circuit is on the lower-frequency side than the pass band; and an anti-resonant frequency of the third serial arm resonance circuit is positioned on the higher-frequency side than the pass band.

14. The band pass acoustic wave filter according to claim 1, wherein
the at least one serial arm resonance circuit includes four series arm resonators; and
the at least one parallel arm resonance circuit includes three parallel arm resonators.

15. The band pass acoustic wave filter according to claim 3, wherein
the at least one serial arm resonance circuit includes four series arm resonators; and
the at least one parallel arm resonance circuit includes three parallel arm resonators.

16. The band pass acoustic wave filter according to claim 1, wherein the bridging capacitor includes a pair of comb-shaped electrodes.

17. The band pass acoustic wave filter according to claim 3, wherein the bridging capacitor includes a pair of comb-shaped electrodes.

18. The band pass acoustic wave filter according to claim 1, wherein the bridging capacitor is a chip capacitor.

19. The band pass acoustic wave filter according to claim 3, wherein the bridging capacitor is a chip capacitor.

* * * * *